US012579989B2

(12) United States Patent
Nagisetty et al.

(10) Patent No.: US 12,579,989 B2
(45) Date of Patent: Mar. 17, 2026

(54) ENCODING DEVICE, DECODING DEVICE, ENCODING METHOD, AND DECODING METHOD

(71) Applicant: Panasonic Intellectual Property Corporation of America, Torrance, CA (US)

(72) Inventors: Srikanth Nagisetty, Singapore (SG); Hiroyuki Ehara, Kanagawa (JP); Akira Harada, Kanagawa (JP); Chong Soon Lim, Singapore (SG)

(73) Assignee: Panasonic Intellectual Property Corporation of America, Torrance, CA (US)

( * ) Notice: Subject to any disclaimer, the term of this patent is extended or adjusted under 35 U.S.C. 154(b) by 406 days.

(21) Appl. No.: 18/009,174

(22) PCT Filed: Apr. 22, 2021

(86) PCT No.: PCT/JP2021/016316
§ 371 (c)(1),
(2) Date: Dec. 8, 2022

(87) PCT Pub. No.: WO2021/256082
PCT Pub. Date: Dec. 23, 2021

(65) Prior Publication Data
US 2023/0238012 A1　Jul. 27, 2023

(30) Foreign Application Priority Data

Jun. 18, 2020　(JP) ................................. 2020-105470

(51) Int. Cl.
*G10L 19/00*　(2013.01)
*G10L 19/002*　(2013.01)
(Continued)

(52) U.S. Cl.
CPC ............ *G10L 19/038* (2013.01); *G10L 19/00* (2013.01); *G10L 19/032* (2013.01); *H03M 7/30* (2013.01);
(Continued)

(58) Field of Classification Search
None
See application file for complete search history.

(56) References Cited

U.S. PATENT DOCUMENTS 12,132,423 B2 * 10/2024 Mori ....................... H02P 23/04
2005/0285764 A1 12/2005 Bessette et al.
(Continued)

FOREIGN PATENT DOCUMENTS

CN　　　1659785　　　8/2005
CN　　102801427　　11/2012
(Continued)

OTHER PUBLICATIONS

"Codec for Enhanced Voice Services (EVS); Detailed Algorithmic Description (Release 16)", 3GPP TS 26.445, V16.0.0 (Jun. 2019).
(Continued)

*Primary Examiner* — Richa Sonifrank
(74) *Attorney, Agent, or Firm* — GREENBLUM & BERNSTEIN, P.L.C.

(57) ABSTRACT

An encoding device is provided with: a quantizing circuit which generates quantization parameters including first information on a vector quantization codebook, and second information on code vectors included in the codebook; and a control circuit which employs the second number of bits based on the difference between the first number of bits available for encoding of a sub-vector in the vector quantization, and the number of bits for the sub-vector quantization parameters, to control encoding of the first information with respect to the sub-vector.

8 Claims, 15 Drawing Sheets

(51) Int. Cl.
    *G10L 19/032*        (2013.01)
    *G10L 19/038*        (2013.01)
    *H03M 7/30*          (2006.01)
    *H03M 7/40*          (2006.01)

(52) U.S. Cl.
    CPC ........... *H03M 7/3082* (2013.01); *H03M 7/40*
    (2013.01); *G10L 2019/0001* (2013.01); *G10L*
    *2019/0005* (2013.01); *G10L 19/002* (2013.01)

(56)           References Cited

U.S. PATENT DOCUMENTS

| 2008/0231483 | A1* | 9/2008 | He | H04N 19/50 |
| | | | | 375/E7.243 |
| 2009/0067503 | A1* | 3/2009 | Jeong | H04N 19/00 |
| | | | | 375/240.12 |
| 2011/0301946 | A1* | 12/2011 | Satoh | H04Q 1/46 |
| | | | | 704/219 |
| 2013/0114738 | A1* | 5/2013 | Chien | H04N 19/18 |
| | | | | 375/240.24 |
| 2014/0249806 | A1* | 9/2014 | Liu | G10L 19/038 |
| | | | | 704/206 |
| 2015/0025879 | A1* | 1/2015 | Liu | G10L 19/16 |
| | | | | 704/230 |
| 2017/0337060 | A1* | 11/2017 | Yamanaka | G06F 9/30021 |
| 2018/0374489 | A1* | 12/2018 | Vasilache | G10L 19/012 |
| 2019/0124348 | A1* | 4/2019 | Yang | G06N 20/20 |
| 2022/0059106 | A1* | 2/2022 | Sugiura | H03M 7/3062 |
| 2023/0045064 | A1* | 2/2023 | Alessi | G10L 15/22 |
| 2023/0238012 | A1* | 7/2023 | Nagisetty | H03M 7/3082 |
| | | | | 704/222 |
| 2024/0187573 | A1* | 6/2024 | Oh | H04N 19/176 |

FOREIGN PATENT DOCUMENTS

| JP | 6027538 | B2 | 11/2016 |
| KR | 2005-0008761 | | 1/2005 |
| WO | 2013/061531 | A1 | 5/2013 |

OTHER PUBLICATIONS

International Search Report (including English Language Translation), mailed Jul. 6, 2021, by the Japan Patent Office (JPO), in International Application No. PCT/JP2021/016316.

Official Communication Received in Indian Patent Application No. 202247072571, dated Jul. 22, 2025.

* cited by examiner

| CODEBOOK NUMBER | CODEBOOK | CODEBOOK INDICATOR | NUMBER OF USED BITS OF CODEBOOK INDICATOR | NUMBER OF USED BITS OF CODE VECTOR INDEX | TOTAL NUMBER OF USED BITS |
|---|---|---|---|---|---|
| 0 | Q0 | 0 | 1 | 0 | 1 |
| 2 | Q2 | 10 | 2 | 8 | 10 |
| 3 | Q3 | 110 | 3 | 12 | 15 |
| 4 | Q4 | 1110 | 4 | 16 | 20 |
| 5 | Q5 | 11110 | 5 | 20 | 25 |
| ... | ... | ... | ... | ... | ... |

FIG. 1

| NUMBER OF UNUSED BITS | 0-4 | 5-9 | 10-14 | 15-19 | 20-24 | 25-29 | 30-34 | ... |
|---|---|---|---|---|---|---|---|---|
| CODE EXAMPLE | 0 | 10 | 110 | 1110 | 11110 | 111110 | 1111110 | ... |
| NUMBER OF BITS | 1 | 2 | 3 | 4 | 5 | 6 | 7 | ... |

FIG. 4

| SUB-VECTOR INDEX | v1 | v2 | v3 | v4 | v5 | v6 | v7 | v8 |
|---|---|---|---|---|---|---|---|---|
| CODEBOOK | Q2 | Q2 | Q3 | Q3 | Q4 | Q4 | Q5 | Q5 |
| CODEBOOK INDICATOR | 10 | 10 | 110 | 110 | 1110 | 1110 | 11110 | 11110 |

FIG. 8

| NUMBER OF UNUSED BITS | 0–4 | 5–9 | 10–14 | 15–19 |
|---|---|---|---|---|
| CODE EXAMPLE | 0 | 10 | 110 | 111 |
| NUMBER OF BITS | 1 | 2 | 3 | 3 |

FIG. 13

| NUMBER OF UNUSED BITS | 0–4 | 5–9 | 10–14 | 15–19 |
|---|---|---|---|---|
| CODE EXAMPLE | 10 | 0 | 110 | 111 |
| NUMBER OF BITS | 2 | 1 | 3 | 3 |

FIG. 14

| CODEBOOK | Q0 | Q2 | Q3 | Q4 |
|---|---|---|---|---|
| CODEBOOK INDICATOR | 0 | 10 | 110 | 111 |
| NUMBER OF BITS | 1 | 2 | 3 | 3 |

FIG. 15

ENCODING DEVICE, DECODING DEVICE, ENCODING METHOD, AND DECODING METHOD

TECHNICAL FIELD

The present disclosure relates to an encoder, a decoder, an encoding method, and a decoding method.

BACKGROUND ART

One quantization method in audio or speech encoding (for example, encoding of an excitation signal) is multi-rate lattice vector quantization (see, for example, Non-Patent Literature (hereinafter referred to as "NPL") 1). The multi-rate lattice vector quantization may be applied to, for example, division vector quantization (referred to as split multi-rate lattice vector quantization or division multi-rate lattice vector quantization, for example). Further, the split multi-rate lattice vector quantization may be applied to, for example, algebraic vector quantization (AVQ).

CITATION LIST

Patent Literature

Patent Literature 1
    WO 2013/061531

Non-Patent Literature

NPL 1
    3GPP TS 26.445 V16.0.0, "Codec for Enhanced Voice Services (EVS); Detailed Algorithmic Description (Release 16)", 2019-06.

SUMMARY OF INVENTION

Technical Problem

However, there is room for consideration on a method of reducing the number of encoded bits in the multi-rate lattice vector quantization.

One non-limiting and exemplary embodiment facilitates providing an encoder, a decoder, an encoding method, and a decoding method each reducing the number of encoded bits in vector quantization.

An encoder according to an exemplary embodiment of the present disclosure includes: quantization circuitry, which, in operation, generates quantization parameters including first information and second information, where the first information is information on a codebook of vector quantization, and the second information is information on a code vector included in the codebook; and control circuitry, which, in operation, controls encoding of the first information with respect to a sub-vector by using a second number of bits based on a difference between a first number of bits usable for encoding of the sub-vector in the vector quantization and the number of bits in the quantization parameters of the sub-vector.

It should be noted that general or specific embodiments may be implemented as a system, an apparatus, a method, an integrated circuit, a computer program, a storage medium, or any selective combination thereof.

According to an exemplary embodiment of the present disclosure, it is possible to reduce the number of encoded bits in multi-rate lattice vector quantization.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF DRAWINGS

FIG. 1 illustrates an example of a codebook list in split multi-rate lattice vector quantization;

FIG. 4 illustrates an example of a correspondence between the numbers of unused bits and the number-of-unused-bits encoded codes;

FIG. 8 illustrates an example of codebooks to be applied to sub-vectors;

FIG. 13 illustrates another example of the correspondence between the numbers of unused bits and the number-of-unused-bits encoded codes;

FIG. 14 illustrates another example of the correspondence between the numbers of unused bits and the number-of-unused-bits encoded codes; and FIG. 15 illustrates an example of association between the codebooks and the codebook indicators.

DESCRIPTION OF EMBODIMENTS

Figure 2:
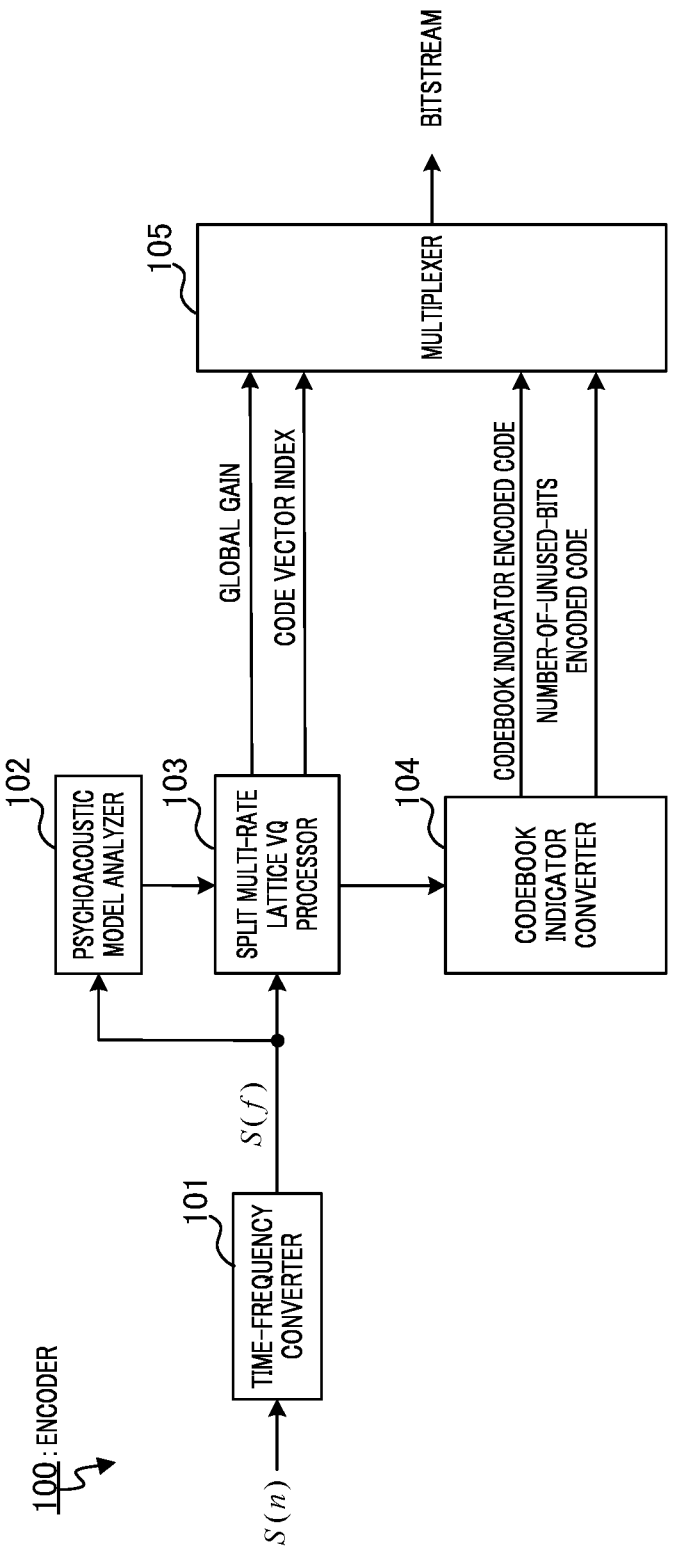
FIG. 2 is a block diagram illustrating a configuration example of an encoder.

Hereinafter, embodiments of the present disclosure will be described in detail with reference to the accompanying drawings.

For example, in the split multi-rate lattice vector quantization, a signal in a frequency domain (or a spectral domain) may be divided into a plurality of sub-vectors (SVs; also referred to as subbands) and the multi-rate lattice vector quantization may be performed on each of the plurality of divided sub-vectors.

FIG. 1 illustrates an example of a list of codebooks (also referred to as code books) in the multi-rate lattice vector quantization with respect to sub-vectors (see, for example, Patent Literature (hereinafter referred to as "PTL") 1 or NPL 1).

For example, quantization parameters in the split multi-rate lattice vector quantization may include information for identifying a codebook to be used for quantization (referred to as "codebook indicator" or codebook index, for example) and information for identifying a selected code vector among a plurality of code vectors included in the codebook (referred to as "code vector index", for example) as indicated in FIG. 1.

For example, 1, 10, 15, 20, 25, . . . , 5n bits (n is an integer of two or more) may be used for encoding (or quantization) of one sub-vector (SV) in each of codebooks Q0, Q2, Q3, Q4, Q5, . . . , Qn indicated in FIG. 1. Of the number of bits (for example, the total number of used bits) to be used for the encoding using each codebook, 1, 2, 3, 4, 5, . . . , n bits (n is an integer of two or more) may be used for a codebook indicator. In other words, in FIG. 1, the ratio of the number of bits to be allocated for encoding of the codebook indicator to the total number of bits (for example, 5n) to be used for the encoding using each codebook may be 1/5.

Note that, codebook Q0 may include one vector (for example, a zero vector). The zero vector means, for example, that the quantization value of the vector is 0. Accordingly, in codebook Q0, the code vector index may not be defined and the number of bits to be used for the code vector index may be 0.

For example, the encoder may collectively encode a plurality of sub-vectors (for example, eight SVs in NPL 1) by using the codebooks indicated in FIG. 1. Note that, the number of bits available for encoding of a plurality of sub-vectors (referred to as "total number of bits", for example) may be known between the encoder and the decoder.

For example, PTL 1 proposes a method of reducing bits in the split multi-rate lattice vector quantization with respect to eight SVs as an example. For example, based on the number of bits used for seven SVs among the eight SVs, the codebook indicator (codebook index) used for the remaining one SV may be estimated according to following equation 1 (for example, see PTL 1).

(Equation 1)

$$cb'\text{fix} = (\text{Bits}_{available} - \sum_{i \neq P_{fix}} \text{Bits}_{cbvi})/5 \qquad [1]$$

In equation 1, cb'fix denotes an estimated value of the number of used bits in a codebook indicator with respect to one SV (for example, sub-vector number i=Pfix), $\text{Bits}_{available}$ denotes a total number of bits available for encoding of eight SVs, and $\Sigma\text{Bits}_{cbvi}$ denotes a sum of numbers of bits (for example, the total numbers of used bits in FIG. 1) used for encoding of the other seven sub-vectors vi (i≠Pfix) different from sub-vector number i=Pfix.

In PTL 1, for example, the encoder quantizes (or encodes) a difference between an estimated value of the number of used bits in a codebook indicator indicated in equation 1 and an actual number of bits in the codebook indicator with respect to one SV (for example, i=Pfix), and transmits difference information to the decoder. For example, as codebook number n used for one SV is larger, the information amount (for example, the number of bits) of the difference information described above becomes smaller than the codebook indicator and the number of encoded bits can be reduced.

In PTL 1, however, for example, there is a case in which the difference information (in other words, encoding target) is a negative number (for example, −1). Since a quantization level or code corresponding to the negative number is used, the complexity of encoding (or quantization) may increase.

Further, the number of encoded bits may not be reduced in a case where one specific SV is encoded based on codebook Q0 (for example, codebook indicator "0") or codebook Q2 under a special condition (for example, codebook indicator "1").

Here, a special case may be a case where, for example, a total number of bits available for encoding does not include any bit that is not used for encoding and every bit is used for encoding. In this case, for example, "0" at the end (also referred to as the stop bit) of a plurality of bits indicating the codebook indicators of the respective codebooks in FIG. 1 may be omitted. For example, in the special case, the codebook indicator of codebook Q2 may be "1" (one bit) obtained by omitting "0" from "10".

Further, for example, when attention is paid to bit reduction of, among a plurality of SVs, SVs whose number of bits used for encoding is more, the number of encoded bits may not be reduced in a case where an SV whose number of bits used for encoding becomes 0 occurs. Note that, the SV whose number of bits used for encoding becomes 0 is likely to be, among the plurality of SVs, a higher-frequency SV (for example, the sixth, seventh, or eighth SV among eight SVs), for example.

Bearing the above in mind, a method of reducing the number of encoded bits to be used for encoding (in other words, variable length-code) of a codebook indicator of multi-rate lattice vector quantization (LUQ: Lattice VQ) applied to split vector quantization (for example, SVQ: Split VQ) will be described in an exemplary embodiment of the present disclosure.

Note that, hereinafter, a case where transform coding is applied to a coding method will be described as an example.

[Configuration Example of Encoder]

FIG. 2 is a block diagram illustrating a configuration example of encoder 100 according to an exemplary embodiment of the present disclosure. Encoder 100 illustrated in FIG. 1 may include, for example, time-frequency converter 101, psychoacoustic model analyzer 102, split multi-rate lattice vector quantization (VQ) processor 103 (corresponding to the quantization circuitry, for example), codebook indicator converter 104 (corresponding to the control circuitry, for example), and multiplexer 105.

Time-frequency converter 101 may convert, for example, input signal S(n) in time domain into input signal S(f) in frequency domain (also referred to as a spectral coefficient) by using a time-frequency conversion method such as Discrete Fourier Transform (DFT) or Modified Discrete Cosine Transform (MDCT). Time-frequency converter 101 may output, for example, input signal S(f) in frequency domain to psychoacoustic model analyzer 102 and split multi-rate lattice VQ processor 103.

Psychoacoustic model analyzer 102 may perform, for example, a psychoacoustic modeling analysis on input signal S(f) in frequency domain inputted from time-frequency converter 101 to acquire a masking curve. Psychoacoustic model analyzer 102 may output, for example, information on the acquired masking curve to split multi-rate lattice VQ processor 103.

Split multi-rate lattice VQ processor 103 may perform, for example, split multi-rate lattice quantization on input signal S(f) in frequency domain inputted from time-frequency converter 101. For example, split multi-rate lattice VQ processor 103 may divide input signal S(f) into a plurality of sub-vectors (SVs) and quantize each of the plurality of sub-vectors to produce quantization parameters that includes a codebook indicator indicating a codebook and a code vector index indicating one of a plurality of code vectors included in the codebook.

Further, for example, split multi-rate lattice VQ processor 103 may apply split multi-rate lattice VQ to input signal S(f) in frequency domain in accordance with the information on the masking curve inputted from psychoacoustic model analyzer 102. Thus, for example, quantization noise in split multi-rate lattice VQ may be inaudible.

For example, split multi-rate lattice VQ processor 103 may output, among the quantization parameters obtained by the quantization, a global gain and a code vector index to multiplexer 105. Further, for example, split multi-rate lattice VQ processor 103 may output, among the quantization parameters obtained by the quantization, the codebook indicator and information on the code vector index to codebook indicator converter 104. Further, split multi-rate lattice VQ processor 103 may output, for example, information on the number of bits (for example, Bits$_{available}$) usable for encoding of input signal S(f) to codebook indicator converter 104.

Codebook indicator converter 104 may convert, for example, encoding information (also referred to as an encoded code) of the codebook indicator based on the information inputted from split multi-rate lattice VQ processor 103.

For example, codebook indicator converter 104 may perform following processing of steps 1 to 3 based on the respective codebook indicators of a plurality of sub-vectors inputted from split multi-rate lattice VQ processor 103.
(Step 1)

For example, codebook indicator converter 104 configures, among the plurality of (for example, N) codebook indicators, codebook indicators of other sub-vectors (for example, N−1 sub-vectors) different from a sub-vector at a predetermined position to codes (or encoded codes). Then, codebook indicator converter 104 may calculate, for example, a sum of numbers of used bits in the codebook indicators and numbers of used bits in the code vector indexes with respect to the N−1 sub-vectors.
(Step 2)

Codebook indicator converter 104 may calculate, for example, the number of bits usable for a codebook indicator of a sub-vector at a predetermined position. For example, codebook indicator converter 104 may calculate the number of bits usable for the codebook indicator of the sub-vector at the predetermined position by subtracting a sum of the numbers of bits used for encoding of the N−1 sub-vectors calculated in (step 1) from the total number of bits (Bits$_{available}$) usable for the encoding of input signal S(f).
(Step 3)

For example, codebook indicator converter 104 may calculate, of the number of bits usable for encoding of the sub-vector at the predetermined position calculated in (step 2), the number of bits that are not used for encoding (referred to as the number of unused bits, for example) to encode the number of unused bits. For example, codebook indicator converter 104 may calculate the number of unused bits by subtracting a sum of the number of bits used for the codebook indicator of the sub-vector at the predetermined position and the number of bits used for the code vector index thereof from the number of usable bits calculated in (step 2).

Codebook indicator converter 104 may output, for example, the codebook indicator (encoded code) obtained by (step 1) to (step 3) and number-of-unused-bits encoded code to multiplexer 105.

Note that, an operation example of codebook indicator converter 104 will be described later.

Multiplexer 105 may multiplex the global gain and code vector index inputted from split multi-rate lattice VQ processor 103 and the codebook indicator (encoded code) and number-of-unused-bits encoded code inputted from codebook indicator converter 104, and transmit multiplexed bitstream information to decoder 200.

Next, an operation example of codebook indicator converter 104 will be described.

Figure 3:
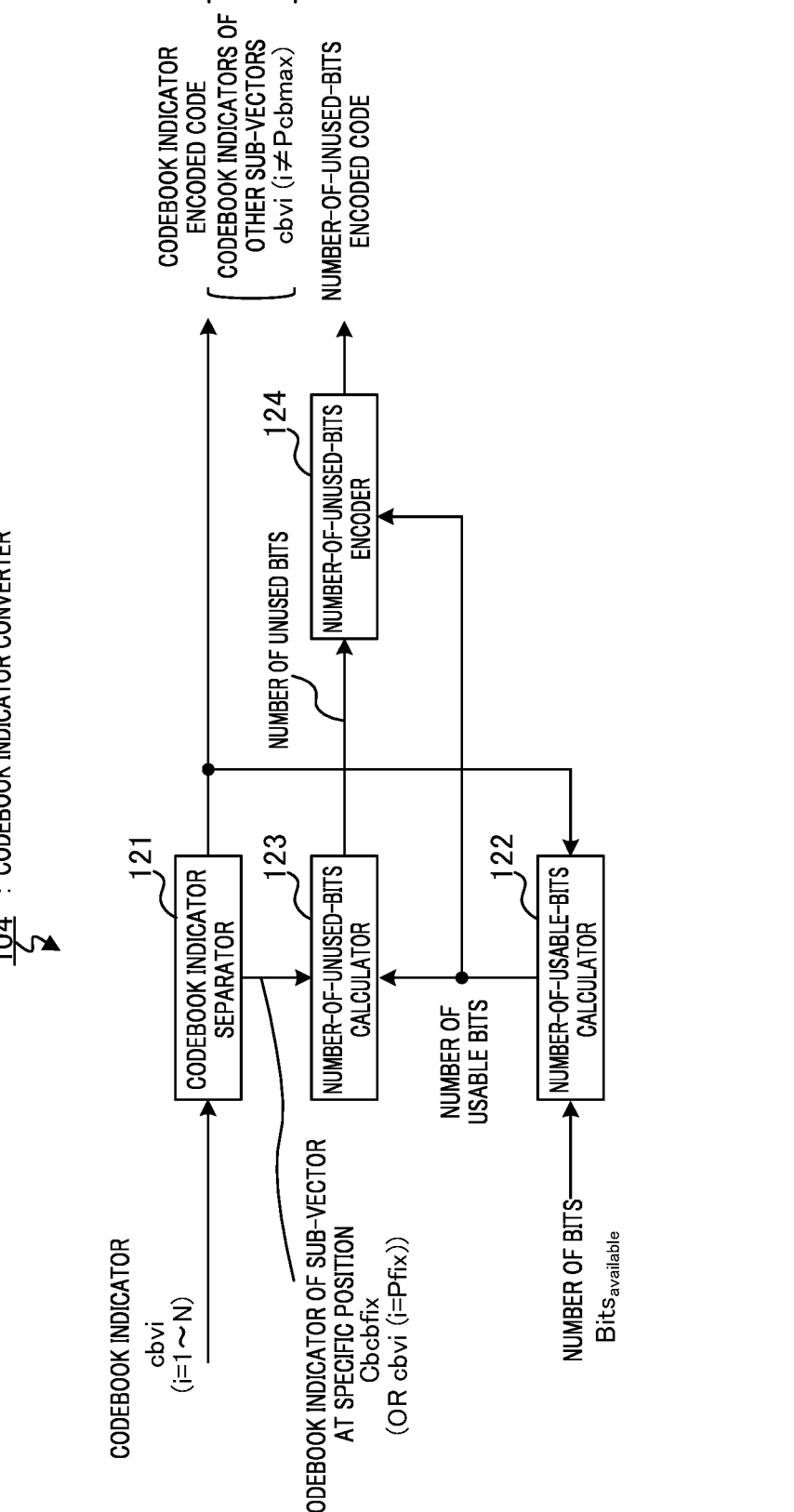
FIG. 3 is a block diagram illustrating a configuration example of a codebook indicator converter.

FIG. 3 is a block diagram illustrating a configuration example of codebook indicator converter 104. Codebook indicator converter 104 illustrated in FIG. 3 may include, for example, codebook indicator separator 121, number-of-usable-bits calculator 122, number-of-unused-bits calculator 123, and number-of-unused-bits encoder 124.

For example, codebook indicators cbvi (i=one of 1 to N) of the N sub-vectors outputted from split multi-rate lattice VQ processor 103 may be inputted to codebook indicator separator 121.

For example, codebook indicator separator 121 may output, based on the N codebook indicators cbvi to be inputted, codebook indicator cbfix x (or cbvi (i=Pfix)) of a sub-vector at predetermined a position (for example, i=Pfix) to number-of-unused-bits calculator 123. Further, codebook indicator separator 121 may output codebook indicators cbvi (i≠Pfix) of the N−1 sub-vectors different from that at the predetermined position to number-of-usable-bits calculator 122 as well as may output the same as a codebook indicator (encoded code) to multiplexer 105 (which corresponds to step 1 described above).

Number-of-usable-bits calculator 122 may calculate, for example, the number of bits usable for encoding of the sub-vector at the predetermined position (which corresponds to step 2 described above). For example, number-of-usable-bits calculator 122 may calculate the number of bits usable for the encoding of the sub-vector at the predetermined position by subtracting the number of bits used for the encoding of the N−1 sub-vectors, which are calculated using the N−1 codebook indicators (cbvi (i≠Pfix)), from number Bits$_{available}$ of bits to be inputted. Number-of-usable-bits calculator 122 may output the calculated number of usable bits to number-of-unused-bits calculator 123 and number-of-unused-bits encoder 124.

For example, number-of-usable-bits calculator 122 may calculate number cb'fix of usable bits in accordance with following equation 2.

(Equation 2)

$$cb'\mathrm{fix} = (\mathrm{Bits}_{available} - \sum_{i \neq P_{fix}} \mathrm{Bits}_{cbvi}) \qquad [2]$$

In equation 2, cb'fix denotes the number of bits usable for encoding of a codebook indicator with respect to one SV (for example, sub-vector number i=Pfix), Bits$_{available}$ denotes a total number of bits available for encoding in transmission units of input signal S(f), and Bits$_{cbvi}$ denotes the number of bits to be used for encoding of sub-vector vi of sub-vector number i (for example, a sum of the number of used bits in a codebook indicator and the number of used bits in a code vector).

As described above, number-of-usable-bits calculator 122 calculates number cb'fix of usable bits, which can be used for encoding of the sub-vector at the predetermined position, by subtracting the number of bits (for example, $\Sigma Bits_{cbvi}$ ($i \neq Pfix$)) to be used for the encoding of the N−1 sub-vectors from total number $Bits_{available}$ of bits as indicated in equation 2, for example.

Number-of-unused-bits calculator 123 may calculate the number of unused bits that are not used for the encoding of input signal S(f) (which corresponding to step 3 described above).

For example, number-of-unused-bits calculator 123 may calculate the number of bits to be used for the encoding of the sub-vector at the predetermined position (for example, the number of bits to be used for encoding of the codebook indicator and the code vector index) based on the number of used bits (actual value cbfix) of the codebook indicator of the sub-vector at the predetermined position, which is inputted from codebook indicator separator 121. Then, number-of-unused-bits calculator 123 may calculate, for example, the number of unused bits by subtracting the number of bits to be used for the encoding of the sub-vector at the predetermined position from the number of usable bits inputted from number-of-usable-bits calculator 122. Number-of-unused-bits calculator 123 may output, for example, information on the calculated number of unused bits to number-of-unused-bits encoder 124.

Number-of-unused-bits encoder 124 may generate, for example, a number-of-unused-bits encoded code (also referred to as encoding information) by encoding the number of unused bits inputted from number-of-unused-bits calculator 123. For example, number-of-unused-bits encoder 124 may generate a number-of-unused-bits information encoded code from the number of unused bits based on the association (which may be represented in a table, for example) between the number of unused bits and the number-of-unused-bits encoded code (or code) indicated in FIG. 4. Number-of-unused-bits encoder 124 may output, for example, the number-of-unused-bits encoded code to multiplexer 105.

Here, the number of unused bits is an integer equal to or larger than 0 as illustrated in FIG. 4. Further, in FIG. 4, the number of candidates (in other words, quantization resolution) for the unused bits to be allocated to one code is five. In other words, in FIG. 4, the same code is allocated to five integers among the number of unused bits. This is because, as illustrated in FIG. 1 for example, in a case where the number of used bits in a codebook indicator is equal to or larger than two, the number of used bits in the codebook indicator and the number of used bits in the code vector index are in a relationship of 1:4, and the total number of used bits to be used for encoding, which combines both the number of used bits in the codebook indicator and the number of used bits in the code vector index, varies in units of 5.

Further, number-of-unused-bits encoder 124 may modify, for example, the code word of the maximum number of unused bits by using the number of usable bits inputted from number-of-usable-bits calculator 122. For example, in a case where the number of usable bits is 23 bits, the maximum number possible of unused bits is 22 bits (for example, in a case where codebook Q0 is used). In the example of FIG. 4, the code word thereof is 11110 (five bits). For example, number-of-unused-bits encoder 124 may change (or modify) this code word 11110 to 1111 (four bits). This is because, in a case where the number of usable bits is 23 bits, a code word corresponding to the number of unused bits of 25 bits or more is impossible, thus it is determined that the number of unused bits is 20 to 24 bits at the time when the higher four bits of the code word are "1111" (in other words, regardless of the least significant bit of the code word). Thus, the number of encoded bits in a case where the number of unused bits becomes maximum can be suppressed by one bit.

[Configuration Example of Decoder]

Figure 5:
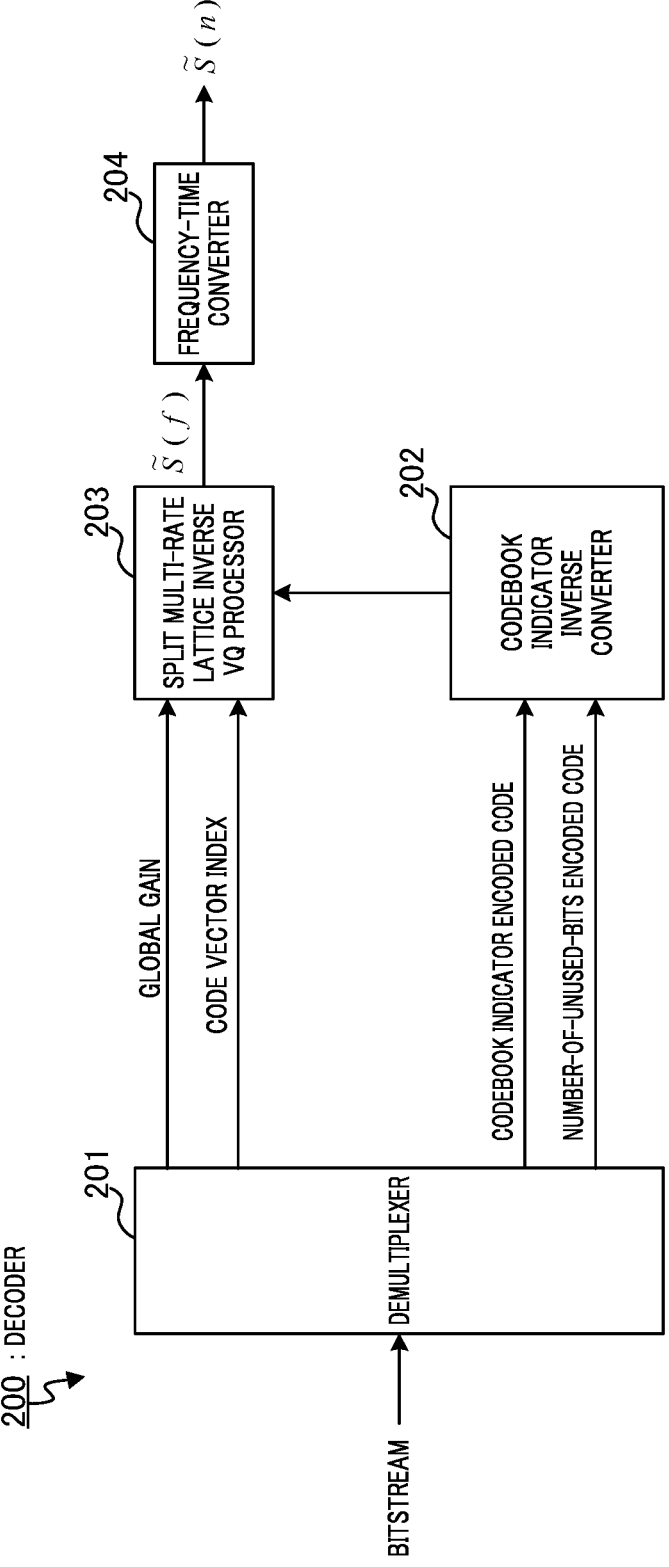
FIG. 5 is a block diagram illustrating a configuration example of a decoder.

FIG. 5 is a block diagram illustrating a configuration example of decoder 200 according to an exemplary embodiment of the present disclosure. Decoder 200 indicated in FIG. 5 may include, for example, demultiplexer 201, codebook indicator inverse converter 202 (corresponding to the control circuitry, for example), split multi-rate lattice inverse quantization (inverse VQ) processor 203 (corresponding to the inverse quantization circuitry, for example), and frequency-time converter 204.

In decoder 200, a bitstream transmitted from encoder 100 is inputted to demultiplexer 201.

Demultiplexer 201 may separate, for example, a global gain, a code vector index, a codebook indicator (encoded code), and a number-of-unused-bits information encoded code from the inputted bitstream. For example, demultiplexer 201 may output the global gain and code vector index to split multi-rate lattice inverse VQ processor 203, and output the codebook indicator (encoded code) and number-of-unused-bits information encoded code to codebook indicator inverse converter 202.

Codebook indicator inverse converter 202 may calculate, for example, a codebook indicator of a sub-vector at a predetermined position (for example, i=Pfix) based on information inputted from demultiplexer 201.

For example, codebook indicator inverse converter 202 may perform processing of following steps 4 to 7 based on the codebook indicator (encoded code) and number-of-unused-bits information encoded code inputted from demultiplexer 201.

(Step 4)

Codebook indicator inverse converter 202 decodes, for example, a codebook indicators of other sub-vectors different from that at the predetermined position (for example, i=Pfix) based on the codebook indicator (encoded code). Further, codebook indicator inverse converter 202 may calculate, for example, the number of bits to be used for encoding of a plurality of sub-vectors (for example, i≠Pfix) (for example, a sum of numbers of used bits in the codebook indicator and numbers of used bits in the code vectors) based on the decoded codebook indicators.

(Step 5)

Codebook indicator inverse converter 202 may decode, for example, the number of unused bits based on the number-of-unused-bits information encoded code.

(Step 6) Codebook indicator inverse converter 202 may calculate, for example, the number of encoded bits of the sub-vector at the predetermined position based on the number of encoded bits of the plurality of sub-vectors calculated in (step 4) and the number of unused bits decoded in (step 5).

(Step 7)

Codebook indicator inverse converter 202 may calculate (or decode), for example, the codebook indicator of the sub-vector at the predetermined position based on the number of encoded bits of the sub-vector at the predetermined position calculated in (step 6).

Codebook indicator inverse converter 202 may output, for example, the codebook indicators obtained by (step 4) to (step 7) to split multi-rate lattice inverse VQ processor 203.

Note that, an operation example of codebook indicator inverse converter 202 will be described later.

Split multi-rate lattice inverse VQ processor 203 performs, for example, split multi-rate lattice inverse VQ based on the global gain and code vector index inputted from demultiplexer 201 and the outputted codebook indicators inputted from codebook indicator inverse converter 202 to obtain decoded signal $\hat{S}(f)$ in frequency domain. Split multi-rate lattice inverse VQ processor 203 may output decoded signal $\hat{S}(f)$ in frequency domain to frequency-time converter 204.

Frequency-time converter 204 may convert, for example, signal $\hat{S}(f)$ in frequency domain outputted from split multi-rate lattice inverse VQ processor 203 to signal $\hat{S}(n)$ in time domain by a frequency-time conversion method such as inverse Discrete Fourier Transform (IDFT) or Inverse Modified Discrete Cosine Transform (IMDCT).

Next, an operation example of codebook indicator inverse converter 202 will be described.

Figure 6:
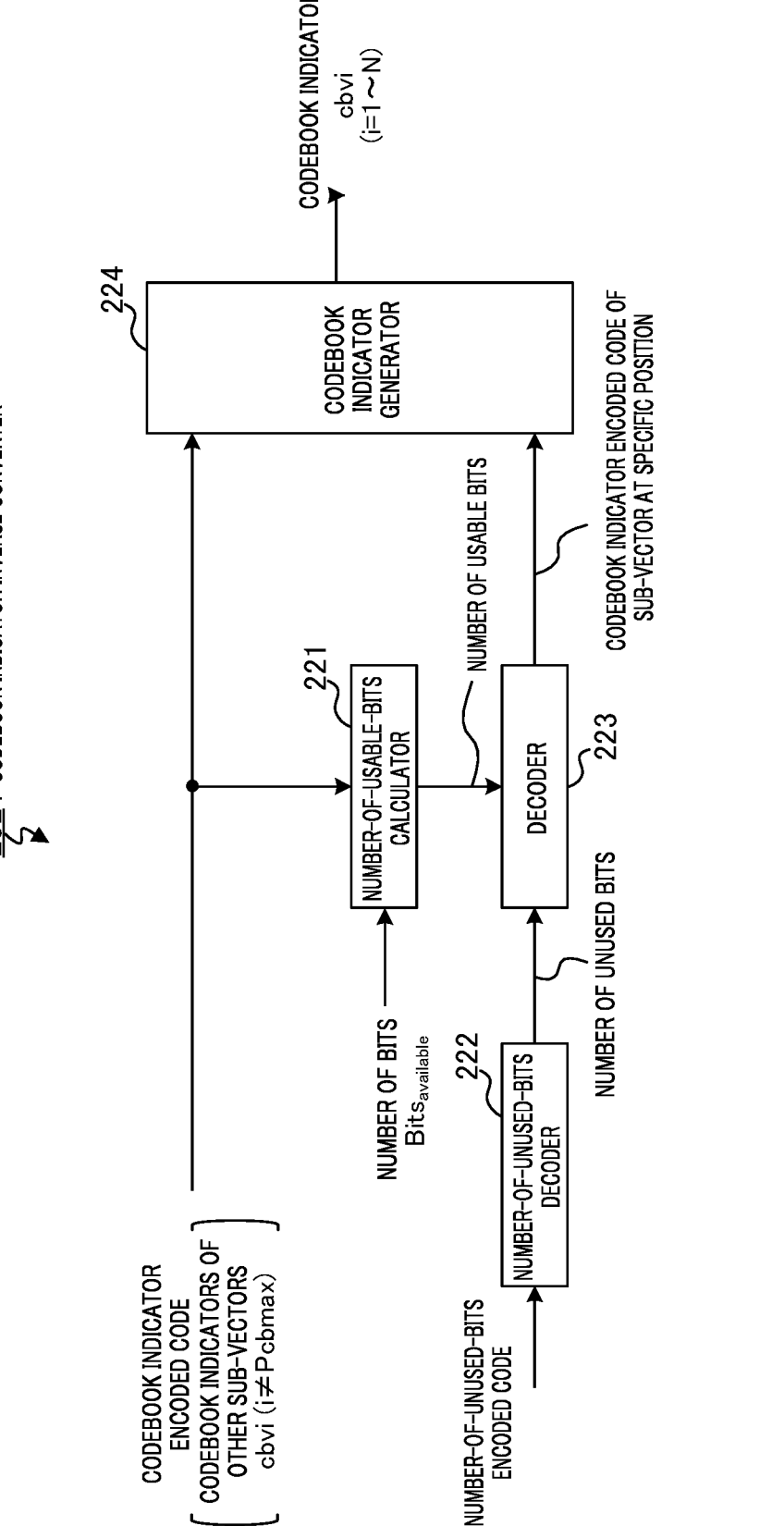
FIG. 6 is a block diagram illustrating a configuration example of a codebook indicator inverse converter.

FIG. 6 is a block diagram illustrating a configuration example of codebook indicator inverse converter 202. Codebook indicator inverse converter 202 illustrated in FIG. 6 may include, for example, number-of-usable-bits calculator 221, number-of-unused-bits decoder 222, decoder 223, and codebook indicator generator 224.

For example, the codebook indicator (encoded code) outputted from demultiplexer 201) may be inputted to number-of-usable-bits calculator 221 and codebook indicator generator 224. Further, for example, the number-of-unused-bits encoded code outputted from demultiplexer 201 may be inputted to number-of-unused-bits decoder 222.

Note that, the codebook indicator (encoded code) to be inputted may represent, for example, codebook indicators cbvi (i≠Pfix) of N−1 sub-vectors different from a sub-vector at a specific position (for example, i=Pfix).

Number-of-usable-bits calculator 221 may calculate, for example, the number of bits usable for encoding of a sub-vector at a predetermined position. For example, number-of-usable-bits calculator 221 may calculate the number of bits to be used for encoding of N−1 sub-vectors by using N−1 codebook indicators (cbvi (i≠Pfix)) (which corresponds to step 4 described above), and may calculate number cb'fix of bits usable for the encoding of the sub-vector at the predetermined position by subtracting the number of bits to be used for the encoding of the N−1 sub-vectors from the number of bits $Bits_{available}$ to be inputted. Number-of-usable-bits calculator 221 may output the calculated number of usable bits to decoder 223.

Number-of-unused-bits decoder 222 may decode, for example, the number-of-unused-bits encoded code inputted from demultiplexer 201. For example, number-of-unused-bits decoder 222 may determine the number of unused bits from the number-of-unused-bits encoded code based on the association between the number of unused bits and the number-of-unused-bits encoded code (for example, code) indicated in FIG. 4 (which corresponds to step 5 described above). Number-of-unused-bits decoder 222 may output, for example, information on the determined number of unused bits to decoder 223.

Decoder 223 may determine (or restore), for example, the codebook indicator of the sub-vector at the predetermined position based on the number of usable bits inputted from number-of-usable-bits calculator 221 and the number of unused bits inputted from number-of-unused-bits decoder 222. For example, decoder 223 may calculate the number of bits (for example, the total number of used bits indicated in FIG. 1) to be used for the encoding of the sub-vector at the predetermined position by subtracting the number of unused bits from the number of usable bits. Then, decoder 223 may calculate the number of bits in the codebook indicator based on the calculated number of bits (for example, the total number of used bits) and output an encoded code indicating the codebook indicator to codebook indicator generator 224 (which corresponds to steps 6 and 7 described above).

For example, codebook indicator generator 224 may generate, based on codebook indicators cbvi (i≠Pfix) of the N−1 sub-vectors inputted from demultiplexer 201 and codebook indicator cbvi (i=Pfix) of the sub-vector at the predetermined position, which is inputted from decoder 223, N codebook indicators cbvi (i=1 to N) such that codebook indicator cbvi, where i=Pfix, is mapped at a predetermined position. Codebook indicator generator 224 may output the generated codebook indicators to split multi-rate lattice inverse VQ processor 203.

[Conversion Example of Codebook Indicator]

Next, an operation example of codebook indicator converter 104 of encoder 100 will be described.

Figure 7:
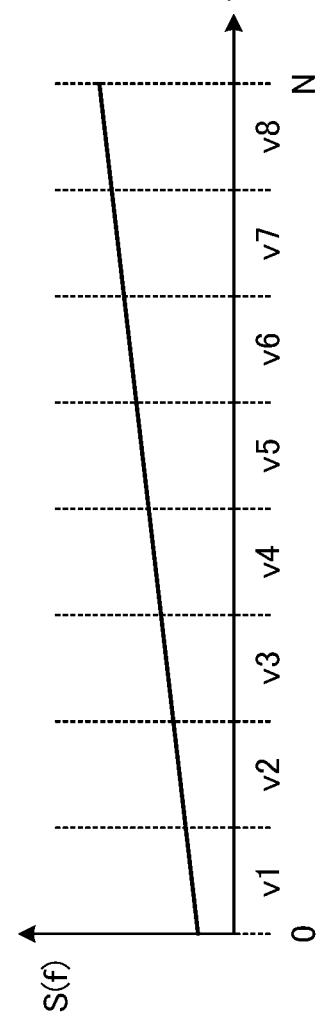
FIG. 7 illustrates an example of a spectrum of an input signal.

FIG. 7 illustrates an example of a spectrum of input signal S(f) in frequency domain. In FIG. 7, input signal S(f) may be divided into eight sub-vectors v1 to v8, for example.

Further, in FIG. 7, it is assumed as an example that a position of a predetermined sub-vector (i=Pfix) in input signal S(f) is v8.

FIG. 8 illustrates an example of codebook indicators (or codebooks) for sub-vectors v1 to v8 obtained by split multi-rate lattice quantization, respectively.

In the examples illustrated in FIGS. 7 and 8, codebook indicator separator 121 in codebook indicator converter 104 outputs, for example, the codebook indicator (for example, five bits of "11110") of sub-vector v8 to number-of-unused-bits calculator 123. Further, for example, codebook indicator separator 121 may output, as encoded codes, the codebook indicators (for example, "10", "10", "110", "110", "1110", "1110", and "11110") of sub-vectors v1 to v7 different from sub-vector v8 to multiplexer 105.

Number-of-usable-bits calculator 122 may calculate, for example, the number of bits usable for encoding of sub-vector v8. For example, it is assumed that a total number of bits ($Bits_{available}$ in equation 2) usable in transmission units of an input signal is 144 bits. In this case, number-of-usable-bits calculator 122 determines, for example, a sum of numbers of used bits (a total number of used bits; for example, $Bits_{cbvi}$ in equation 2) per sub-vector of each of sub-vectors v1 to v7 different from sub-vector v8. Number-of-usable-bits calculator 122 may then calculate, for example, number cb'fix of usable bits=(144−10−10−15−15−20−20−25)=29 in accordance with equation 2.

Number-of-unused-bits calculator 123 may subtract, for example, the number of bits: 25 bits to be used for the encoding of sub-vector v8 from number cb'fix of usable bits=29 bits to calculate the number of unused bits (here, 29−25=4 bits).

Since the number of unused bits is four bits, number-of-unused-bits encoder 124 may generate, for example, number-of-unused-bits encoded code "0" (one bit) based on the association indicated in FIG. 4.

In encoder 100, each codebook indicator (encoded code) thus generated "10", "10", "110", "110", "1110", "1110", and "11110" of sub-vectors v1 to v7, and number-of-unused-bits encoded code "0" are multiplexed by multiplexer 105 and transmitted to decoder 200.

As described above, in the example illustrated in FIG. 7, the codebook number applied to sub-vector v8 is five (Q5), and the number of bits to be used in a case where the codebook indicator itself of codebook Q5 is encoded is five bits. In an exemplary embodiment of the present disclosure, on the other hand, the number of bits of the number-of-unused-bits encoded code to be transmitted instead of the codebook indicator with respect to sub-vector v8 is one bit as described above. Accordingly, in the example illustrated in FIG. 7, notification of the number-of-unused-bits encoded code makes it possible to reduce the encoded bits by four bits in comparison with a case where the codebook indicator itself of sub-vector v8 is encoded and notified. Further, in the present embodiment, codebook-related information is not lost even when the encoded bits are reduced, which makes it possible to restore codebook indicators by decoder 200.

As described above, encoder 100 and decoder 200 control, for example, encoding or decoding of a codebook indicator with respect to a sub-vector by using the number of unused bits based on a difference between the number of bits usable for encoding of the sub-vector in vector quantization (for example, split multi-rate lattice VQ) and the number of bits for quantization parameters (for example, a codebook indicator and a code vector) of the sub-vector.

For example, encoder 100 converts a codebook indicator to be used for encoding of a specific sub-vector in a spectrum of an input signal divided into a plurality of sub-vectors into information on the number of unused bits. In the same manner, decoder 200 uses an encode code of the number of unused bits transmitted from encoder 100 to converts information on the number of unused bits into information on the codebook indicator.

This conversion makes it possible to improve, for example, the efficiency of encoding of a codebook indicator (or codebook index) of one specified SV in lattice vector quantization (LUQ) used in split vector quantization (SVQ). The present embodiment makes it possible to reduce the number of bits used for a codebook indicator used for encoding of a specific sub-vector and to reduce a bit rate.

Further, for example, as described above, in a method of encoding difference information on a difference between an estimated value of a codebook indicator and an actual value thereof as in PTL 1, there may be a case where the difference information of the encoding target is −1. For example, when the number of bits usable for encoding of a specific sub-vector is nine bits, there may be a case where a codebook indicator estimated in PTL 1 may be 0 (Q0), while an actual codebook indicator is 1 (Q1). Accordingly, the complexity of encoding processing such as an association configuration including a quantization level or code corresponding to −1 (a negative number) may be increase. In an exemplary embodiment of the present disclosure, on the other hand, for example, since the number of unused bits in the number of bits including both that of a codebook indicator and that of a code vector index are encoded, the minimum value of the number of unused bits of the encoding target is 0. Since it is not necessary to consider encoding of a negative number, it is possible to simplify encoding processing.

Note that, in the embodiment described above, a case where transform coding is applied to a coding method has been described as an example, but the coding method is not limited to the transform coding. For example, an exemplary embodiment of the present disclosure may be applied to encoding in which each of a plurality of sub-vectors obtained by dividing a signal (spectrum) in frequency domain is quantized.

Note that, in the present embodiment, a total number of usable bits usable for encoding is inputted to number-of-usable-bits calculators 122 and 221. This total number of usable bits may not be information inputted from outside of an encoder (for example, encoder 100) or decoder (for example, decoder 200), but may be information held inside the encoder or decoder. The total number of usable bits may be, for example, a predetermined value. Alternatively, a predetermined value may be used as an initial value, and a value obtained by adding the number of unused bits to the initial value may be inputted as a total number of usable bits at the time of subsequent split multi-rate lattice VQ.

[Application to Layer Coding of CELP (Code Excited Linear Prediction) and Transform Coding]

Figure 9:
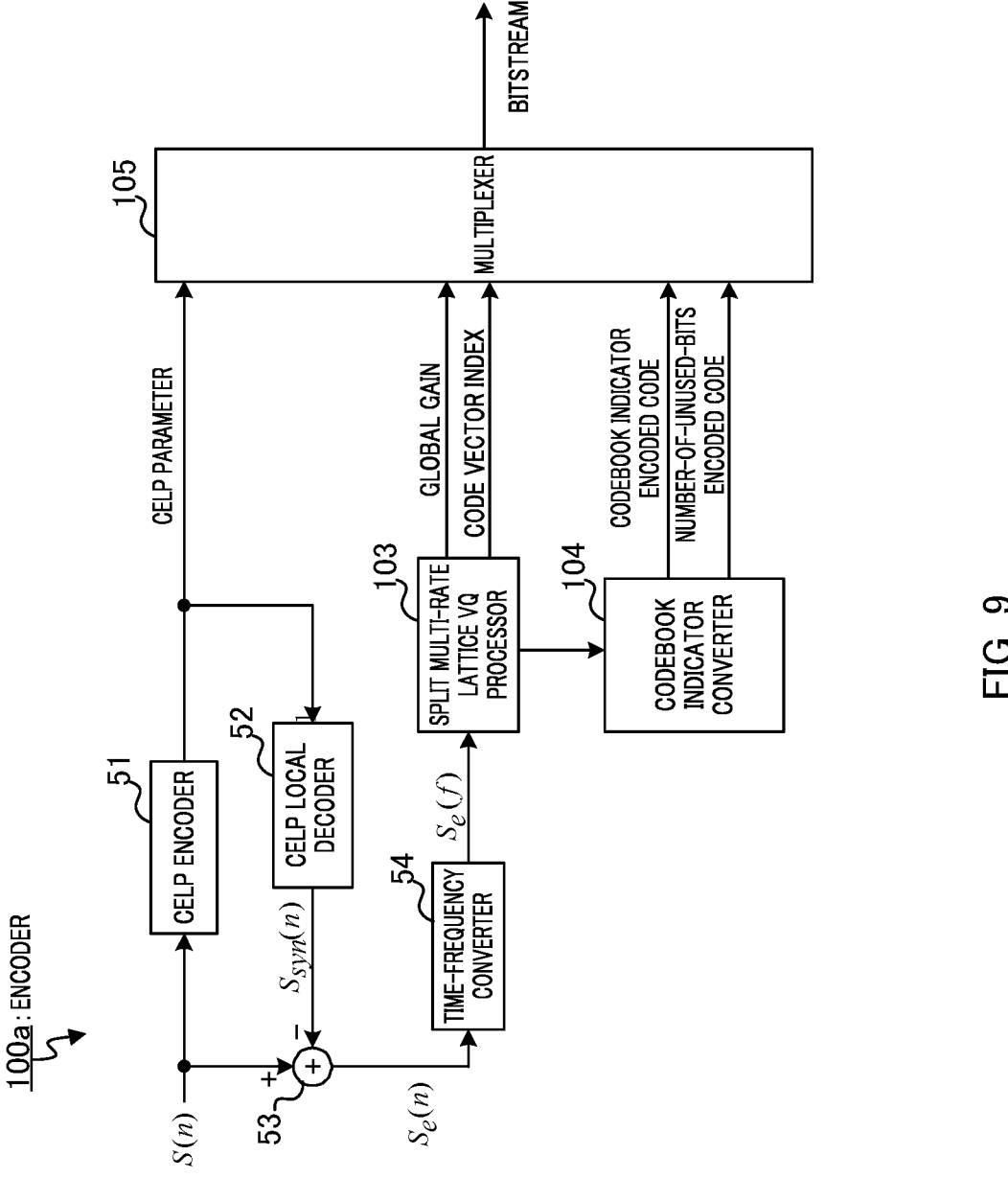
FIG. 9 is a block diagram illustrating another configuration example of the encoder.

For example, split multi-rate lattice VQ according to the present embodiment may be applied to layer coding of CELP and transform coding. FIG. 9 is a block diagram illustrating a configuration example of encoder 100a in a case where split multi-rate lattice VQ is applied to the layer coding of CELP and transform encoding. Further, FIG. 10 is a block diagram illustrating a configuration example of decoder 200a in a case where split multi-rate lattice VQ is applied to the layer coding of CELP and transform encoding.

Figure 10:
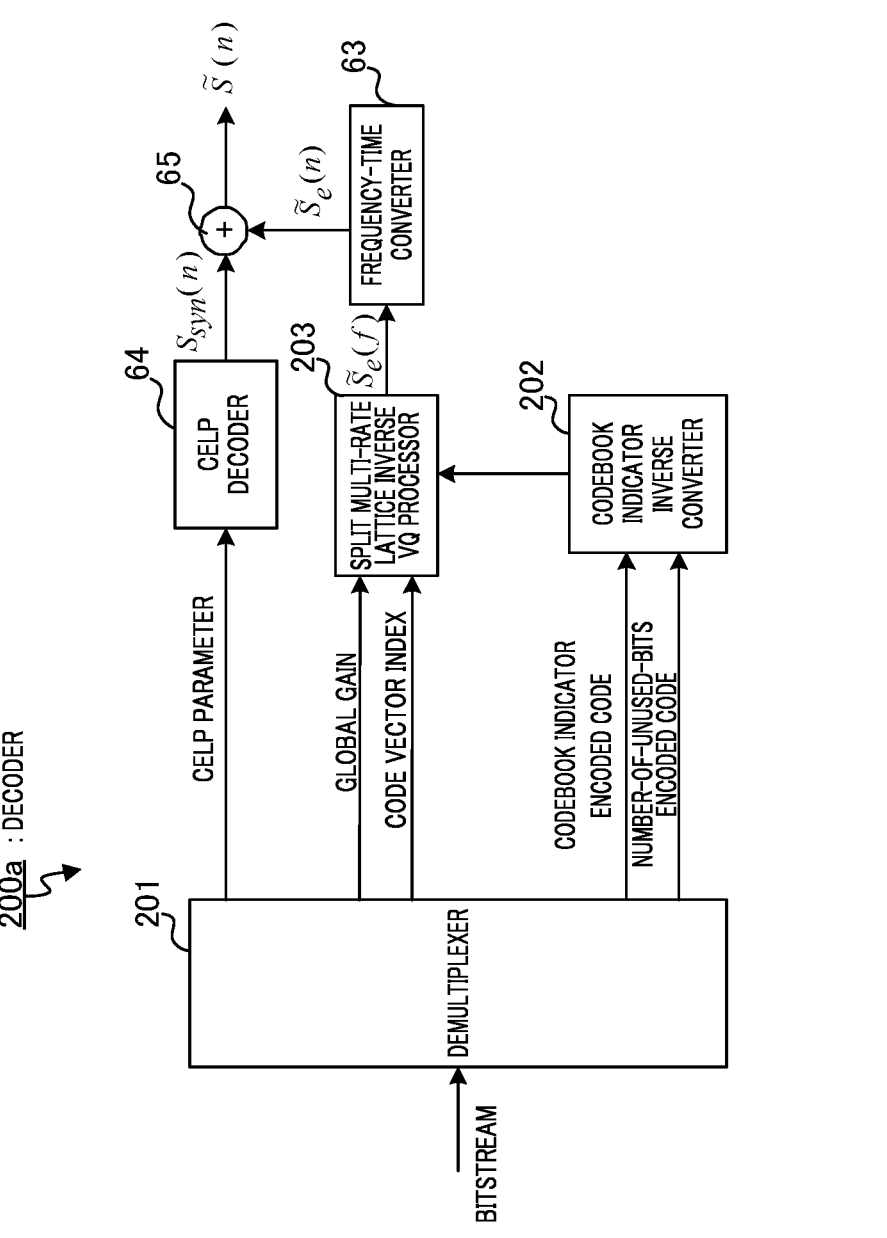
FIG. 10 is a block diagram illustrating another configuration example of the decoder.

Note that, in FIGS. 9 and 10, configuration processors that perform the same processing as those in encoder 100 and decoder 200 are denoted by the same reference signs.

In encoder 100a indicated in FIG. 9, CELP encoder 51 may perform, for example, CELP encoding on signal S(n) in time domain and output a CELP parameter to CELP local decoder 52 and multiplexer 105. Note that, the CELP coding method is, for example, a coding method that utilizes the predictable nature of signals in time domain.

For example, CELP local decoder 52 decodes the CELP parameter inputted from CELP encoder 51 to generate synthesized signal $S_{syn}(n)$.

Adder 53 generates, for example, prediction error signal $S_e(n)$ by subtracting synthesized signal $S_{syn}(n)$ from input signal S(n).

Time-frequency converter 54 converts encoding error signal $S_e(n)$ in time domain into encoding error signal $S_e(f)$ in frequency domain by a time-frequency conversion method such as DFT or MDCT.

As described above, encoding error signal $S_e(f)$ in frequency domain may be quantized by split multi-rate lattice VQ processor 103 and codebook indicator converter 104. For example, encoder 100a may transmit, instead of a codebook indicator (encoded code) of a specific sub-vector among a plurality of sub-vectors obtained by dividing encoding error signal $S_e(f)$, a number-of-unused-bits encoded code to decoder 200a.

In decoder 200a indicated in FIG. 10, demultiplexer 201 separates the bitstream transmitted from encoder 100a into the CELP parameter and quantization parameters, outputs the CELP parameter to CELP decoder 64, the global gain and code vector index among the quantization parameters to split multi-rate lattice inverse VQ processor 203, and outputs the codebook indicator (encoded code) and number-of-unused-bits encoded code among the quantization parameters to codebook indicator inverse converter 202.

For example, as described above, codebook indicator inverse converter 202 determines, based on the codebook indicator (encoded code) and number-of-unused-bits encoded code, a codebook indicator with respect to a sub-vector at a specific position of encoding error signal $S_e(f)$, and outputs information on codebook indicators of N sub-vectors to split multi-rate lattice inverse VQ processor 203.

For example, split multi-rate lattice inverse VQ processor 203 decodes (or inverse quantizes) encoding error signal $S_e^{\sim}(f)$ in frequency domain based on the global gain, codebook indicator, and code vector index.

Frequency-time converter 63 converts, for example, decoded encoding error signal $S_e{}^\sim(f)$ in frequency domain to encoding error signal $S_e{}^\sim(n)$ in time domain by a frequency-time conversion method such as IDFT or IMDCT.

CELP decoder 64 decodes, for example, the CELP parameter to obtain synthesized signal $S_{syn}(n)$.

Adder 65 adds, for example, encoding error signal $S_e{}^\sim(n)$ and synthesized signal $S_{syn}(n)$ to obtain signal $S^\sim(n)$ in time domain.

[Application to TCX (Transform Coded eXcitation) Coding]

Figure 11:
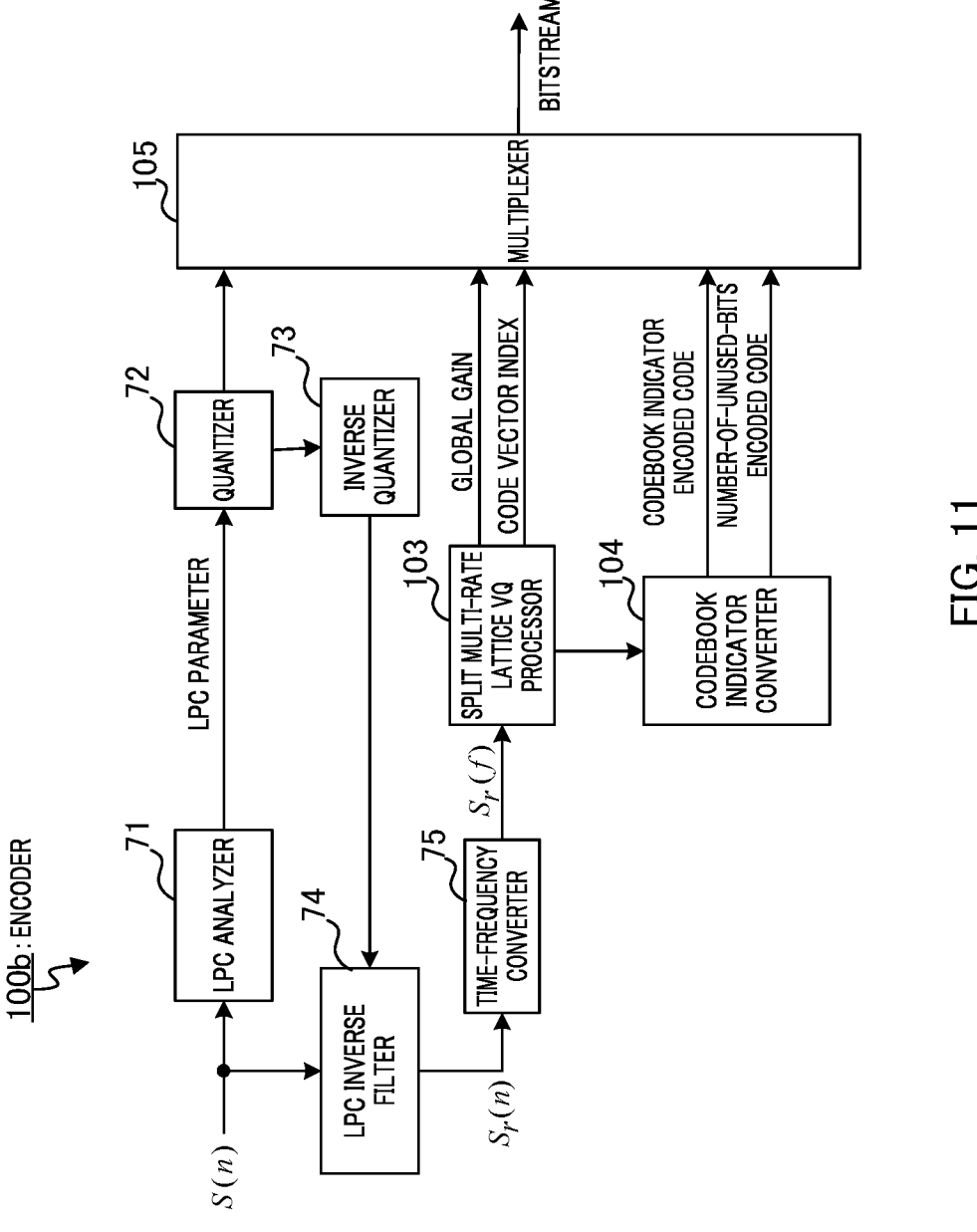
FIG. 11 is a block diagram illustrating another configuration example of the encoder.

For example, split multi-rate lattice VQ according to the present embodiment may be applied to TCX coding (also referred to as TCX codec). FIG. 11 is a block diagram illustrating a configuration example of encoder 100b in this case, and FIG. 12 is a block diagram illustrating a configuration example of decoder 200b.

Figure 12:
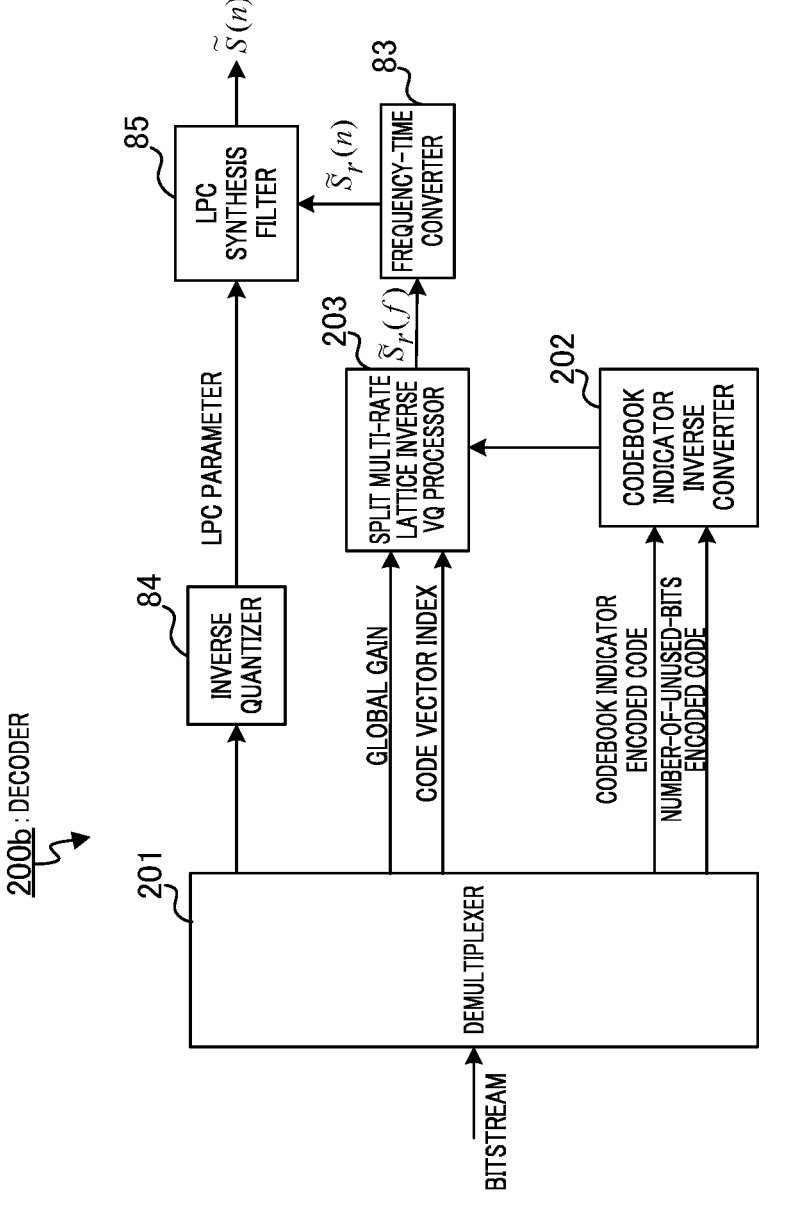
FIG. 12 is a block diagram illustrating another configuration example of the decoder.

Note that, in FIGS. 11 and 12, configuration processors that perform the same processing as those in encoder 100 and decoder 200 are denoted by the same reference signs.

In encoder 100b indicated in FIG. 11, linear predictive coding (LPC) analyzer 71 performs LPC analysis on signal S(n) in time domain, and outputs an LPC parameter to quantizer 72. Note that, the LPC analysis is, for example, a method of utilizing the predictable nature of signals in time domain.

Quantizer 72 quantizes, for example, the LPC parameter inputted from LPC analyzer 71, and outputs quantization parameters (for example, a quantization index) to inverse quantizer 73 and multiplexer 105.

Inverse quantizer 73 inverse quantizes, for example, the quantization index inputted from quantizer 72 to restore the LPC parameter.

LPC inverse filter 74 obtains, for example, residual signal $S_r(n)$ in time domain by applying LPC inverse filtering using the restored LPC parameter inputted from inverse quantizer 73 to input signal S(n).

Time-frequency converter 75 converts, for example, residual signal $S_r(n)$ in time domain into residual signal $S_r(f)$ in frequency domain by a time-frequency conversion method such as DFT or MDCT.

As described above, residual signal $S_r(f)$ in frequency domain may be quantized by split multi-rate lattice VQ processor 103 and codebook indicator converter 104. For example, encoder 100b may transmit, instead of a codebook indicator (encoded code) of a specific sub-vector among a plurality of sub-vectors obtained by dividing residual signal $S_r(f)$, a number-of-unused-bits encoded code to decoder 200b.

In decoder 200b indicated in FIG. 12, demultiplexer 201 separates the bitstream transmitted from encoder 100b into the quantization index and quantization parameters, outputs the quantization index to inverse quantizer 84, the global gain and code vector index among the quantization parameters to split multi-rate lattice inverse VQ processor 203, and outputs the codebook indicator (encoded code) and number-of-unused-bits encoded code among the quantization parameters to codebook indicator inverse converter 202.

For example, as described above, codebook indicator inverse converter 202 determines, based on the codebook indicator (encoded code) and number-of-unused-bits encoded code, a codebook indicator with respect to a sub-vector at a specific position of residual signal $S_r(f)$, and outputs information on codebook indicators of N sub-vectors to split multi-rate lattice inverse VQ processor 203.

For example, split multi-rate lattice inverse VQ processor 203 decodes (or inverse quantizes) residual signal $S_r(f)$ in frequency domain based on the global gain, codebook indicator, and code vector index.

Frequency-time converter 83 converts, for example, decoded residual signal $S_r(f)$ in frequency domain to residual signal $S_r(n)$ in time domain by a frequency-time conversion method such as IDFT or IMDCT.

Inverse quantizer 84 inverse quantizes, for example, the quantization index to restore the LPC parameter.

LPC synthesis filter 85 obtains, for example, signal $S_r(n)$ in time domain by applying LPC synthesis filtering using the restored LPC parameter to residual signal $S_r(n)$ in time domain.

A case where split multi-rate lattice VQ is applied to TCX coding has been described above.

Note that, in the present embodiment, LPC synthesis filtering processing is performed in time domain, but may be performed in frequency domain. As one example of such TCX coding, MDCT based TCX of EVS codec can be mentioned.

[One Example of Sub-Vector at Specific Position]

An example of a sub-vector at a specific position described above will be described.

Split multi-rate lattice VQ may be applied, for example, to acoustic and speech encoding processing and decoding processing such as Enhanced Voice Services (EVS) codec described in NPL 1.

For example, split multi-rate lattice VQ may be applied to an algebraic vector quantizer (AVQ) in NPL 1.

For example, in EVS codec, AVQ is applied to various coding modes. For example, in a case where an encoded frame is classified into a harmonic signal in Generic Coding (GC) mode with 32 kbit/s, the number of encoded bits in a codebook indicator in split multi-rate lattice VQ is highly likely to be more with a higher-frequency sub-vector (for example, sub-vector v8 in FIG. 7).

As reasons for the above, it can be mentioned that encoding in the GC mode with respect to a harmonic signal is highly likely to occur at the onset part of a vowel, that the expressiveness of harmonics by an adaptive codebook (or an adaptive code book) is more likely to deteriorate with a higher frequency band, or that a deviation in harmonics is more likely to occur and an encoding error in an adaptive codebook tends to become larger with a higher frequency band. Accordingly, in encoding of a signal in frequency domain (for example, a prediction error or a spectrum of a residual signal), the energy of the signal becomes larger and a codebook with a larger number of bits used for quantization is likely to be selected with a higher-frequency sub-vector.

Thus, for example, in a case where a signal in frequency domain is divided into eight sub-vectors v1 to v8 as described above, the number of bits used for encoding of, among a plurality of sub-vectors v1 to v8, sub-vector v8 whose frequency band is highest in frequency domain are more likely to be distributed. Accordingly, as described above, sub-vector v8 may be configured as a sub-vector at a specific position in encoder 100 and decoder 200.

Thus, in a case where an input signal (or encoded frame) to be subjected to vector quantization is a harmonic signal in the GC mode of EVS codec, a sub-vector with the highest frequency among a plurality of sub-vectors configuring the input signal may be configured as one sub-vector for performing encoding of the number of unused bits. Thus, it is possible to improve the effect of reducing the number of encoded bits in a case where split multi-rate lattice VQ is applied to AVQ of GC coding.

Note that, in a case where an input signal is not harmonic in the GC mode, split multi-rate lattice VQ may be applied to a signal in time domain depending on the encoding bit rate of EVS. Even in this case, it is effective to configure the last sub-vector (in other words, the temporally rearmost sub-vector) at a predetermined sub-vector position. This is because it was experimentally confirmed that in such a case, the number of bits used for encoding of the number of unused bits tends to be less than the number of bits used for encoding of a codebook indicator. That is, in a frame classified as the GC mode, the number of bits remaining unused at the time of quantization of the last sub-vector becomes often few, thus the encoding efficiency is likely to be higher when the number of unused bits is encoded.

[Method of Reducing Number of Encoded Bits]

Next, an example of a method of reducing the number of encoded bits for a sub-vector at a specific position will be described.

<Method 1>

For example, in a case where the number of bits to be used for encoding of a sub-vector (for example, sub-vector v8) at a specific position is few (for example, codebook Q0 or Q2) and the number of unused bits is a lot (for example, a case of being larger than a threshold value such as 15 bits), the number of bits used for encoding of the number of unused bits may be more than that in a case where a codebook indicator itself is encoded.

For example, in a case where the number of usable bits (cb'fix) usable for encoding of a sub-vector at a specific position is equal to or less than nine bits, the codebook usable for the sub-vector (for example, sub-vector v8) at the specific position is codebook Q0 (the codebook indicator is one bit of "0") or codebook Q2 in a special case (the codebook indicator is one bit of "1").

For example, since the codebook indicator is expressed by one bit (in other words, the minimum value) in either case of codebook Q0 or codebook Q2 in the special case, the number of encoded bits cannot be reduced even by a method according to an exemplary embodiment of the present disclosure.

Accordingly, for example, in a case where the number of bits usable for a sub-vector at a specific position is equal to or less than a threshold value (for example, nine bits or less), encoder 100 may determine, as an encoded code (or encoding information), a codebook indicator of the sub-vector at the specific position as is without applying a method according to an exemplary embodiment of the present disclosure (for example, a method of encoding the number of unused bits).

On the other hand, for example, in a case where the number of bits usable for a sub-vector at a specific position is larger than a threshold value (for example, in the case of being larger than nine bits), encoder 100 may determine, as encoding information, an encoded code obtained by encoding the number of unused bits.

Method 1 makes it possible to suppress an increase in the number of encoded bits and to improve the efficiency of encoding in the case of any number of bits usable for a sub-vector at a specific position.

Further, since the number of bits usable for a sub-vector at a specific position is information that can be calculated from other parameters (for example, a total number of bits, and codebook indicators of other sub-vectors) even in decoder 200 as described above, it is not necessary to provide signaling for switching the encoding method according to Method 1 (for example, additional information for notifying the switching).

<Method 2>

For example, in a case where the number of usable bits (cb'fix) is one of 11 to 13 bits, the codebook usable for a sub-vector (for example, sub-vector v8) at a specific position is either codebook Q0 (for example, the total number of used bits: one bit) or codebook Q2 (for example, the total number of used bits: 10 bits). Here, for example, in a case where codebook Q0 is used (for example, the total number of used bits: one bit), the number of unused bits becomes 10 to 12 bits, thus in the example illustrated in FIG. 4, the number of encoded bits of the number of unused bits becomes three bits. Accordingly, the number of bits increases by two bits in comparison with a case where a codebook indicator is encoded as is (for example, one bit).

Incidentally, since the total number of used bits in the case of codebook Q2 is 10 bits as indicated in FIG. 1, it is apparent that at least one to three bits become unused in a case where the number of usable bits is one of 11 to 13 bits.

The number of apparently unused bits of the number of usable bits as such can be calculated, for example, as a remainder of five with respect to the number of usable bits. For example, in a case where the number of usable bits is 11, 12 or 13, the remainder of five is one (=11%5), two (=12%5), or three (=13%5). Note that, the function "a % b" is a function that returns the remainder of b with respect to a (also referred to as the modulo operation, for example). Note that, divisor b (here, b=five) may be a value determined based on the ratio of a number of bits to be used for a codebook indicator to a total number of used bits in encoding of a sub-vector (or the unit of a change in a total number of used bits).

Information of the number of apparently unused bits as such may not be transmitted as encoding information from encoder 100 to decoder 200. Accordingly, encoder 100 may subtract a remainder of five (in other words, the number of apparently unused bits) with respect to the number of usable bits (cb'fix) from the number of usable bits and calculate the number of unused bits by using the subtraction result.

For example, in a case where the number of usable bits is one of 11 to 13 bits, the remainder of five with respect to the number of usable bits is one to three bits. Accordingly, the subtraction result is 10 bits. For example, encoder 100 may configure 10 bits of the subtraction result as usable bits. For example, in a case where encoder 100 uses codebook Q0 (one bit) for 10 usable bits, the number of unused bits becomes nine bits and are therefore encoded to a 2-bit number-of-unused-bits encoded code in the example illustrated in FIG. 4.

Thus, the number of bits (for example, two bits) to be used for encoding of the number of unused bits in a case where a remainder of five is subtracted from the number of usable bits are reduced in comparison with the number of bits (for example, three bits) to be used for encoding of the number of unused bits in a case where a remainder of five is not subtracted from a number of usable bits. In other words, for example, a case where a remainder of five is subtracted from the number of usable bits makes is possible to suppress an increase in the number of bits to one bit in comparison with a case where a codebook indicator is encoded as is (for example, one bit).

<Method 3>

For example, in a case where the number of usable bits (cb'fix) is 10 bits, the number of unused bits does not become 10 bits or more (in other words, nine bits or less), thus, the "0" of code "10" corresponding to the numbers of unused bits, 5 to 9, does not have to be present in the example illustrated in FIG. 4. In other words, in this case, it is sufficient when the numbers of unused bits, which are 0 to 4 (code "0"), and the numbers of unused bits, which are 5 to 9 (code "1") are distinguished. Such encoding makes it possible to reduce the number of bits used for a code of the number of unused bits further by one bit and to suppress an increase in the number of bits.

Note that, a case where such encoding is used makes it possible to suppress an increase in the number of bits even when the number of usable bits is equal to or less than nine bits. Accordingly, for example, even when the number of usable bits is equal to or less than nine bits, encoder 100 may not perform switching to a method of configuring a codebook indicator as is to a code as described in <Method 1>.

<Method 4>

For example, in a case where the number of usable bits (cb'fix) is equal to or less than eight bits, there is no possibility that the codebook indicator will be a value other than "0" (Q0) in the example illustrated in FIG. 1. In this case, decoder 200 is capable of specifying codebook indicator Q0 even when no codebook indicator-related information is transmitted.

Accordingly, for example, in a case where the number of usable bits is equal to or less than eight bits in both a method of encoding an codebook indicator as is and a method of encoding the number of unused bits, encoding processing and decoding processing without transmission and reception of information on the codebook indicator of codebook Q0 may be performed. Thus, it is possible to reduce encoding information by one bit.

<Method 5>

For example, in a case where the number of usable bits (cb'fix) is 14 bits, the codebooks usable for the sub-vector at the specific position in the example illustrated in FIG. 1 is codebooks Q0 and Q2, and codebook Q3 in a special case. In codebook Q3 in the special case, for example, there are no unused bits, the codebook indicator can be expressed by "11" (two bits) instead of "110", and encoding can be performed with 14 bits together with the number of used bits (12 bits) of the code vector.

Thus, since codebook Q3 is usable even in a case where the number of usable bits is 14 bits, four bits which are a remainder of five in <Method 2> may not be the number of apparently remaining bits in a case where the number of usable bits is 14 bits.

Accordingly, for example, in a case where the number of usable bits is equal to or less than 13 bits, an increase in the number of encoded bits equal to or larger than two bits can be suppressed based on at least one of <Method 1> to <Method 4> described above, whereas in a case where the number of usable bits is equal to or larger than 14 bits, the number of unused bits may increase or decrease.

Further, for example, in multi-mode encoding such as EVS codec, it is assumed that a case where unused bits occupy most of bits usable when split multi-rate lattice VQ is used in specific coding mode (for example, a case where the number of unused bits is equal to or larger than a threshold value) is rare. Accordingly, for example, the number of unused bits less than a threshold value are likely to be encoded, and a reduction in the number of bits is achievable on average. On the other hand, it is rare but a case where the number of unused bits becomes numerous and the number of encoded bits increases by two bits or more may also occur. Accordingly, for example, the encoding method may be switched based on the following method.

For example, in a case where split multi-rate lattice VQ is applied to AVQ in the GC mode of EVS codec, the number of unused bits tends to be more as the input signal is closer to zero. Further, for example, the determination of whether the input signal is close to zero can be performed based on the energy of an adaptive codebook vector or information on a gain to be multiplied by an excitation signal to be encoded by AVQ (or gain information).

Thus, for example, in a case where the energy of an adaptive codebook vector (or codebook vector) is less than a threshold value (for example, 10) or in a case where the gain to be multiplied by an excitation signal to be encode by AVQ is less than a threshold value (for example, 1.0), encoder 100 may determine, as an encoded code, a codebook indicator with respect to a sub-vector at a specific position as is without applying a method (for example, a method of encoding the number of unused bits) according to an exemplary embodiment of the present disclosure.

On the other hand, for example, in a case where the energy of an adaptive codebook vector is equal to or larger than a threshold value (for example, 10) or in a case where the gain to be multiplied by an excitation signal to be encode by AVQ is equal to or larger than a threshold value (for example, 1.0), encoder 100 may determine, as encoding information, an encoded code obtained by encoding the number of unused bits.

Note that, encoder 100 may switch the encoding method based on, for example, a combination of the energy of an adaptive codebook vector and the gain to be multiplied by an excitation signal number to be encoded by AVQ. In this case, for example, in the determination of switching of the encoding method, encoder 100 may perform weighting on each of the energy of the adaptive codebook vector and the gain to be multiplied by the excitation signal number.

Further, for example, the gain to be multiplied by an excitation signal number to be encoded by AVQ is not determined until AVQ coding is completed in a frame to be encoded, temporally previous information on a gain in the frame may be referred.

Further, although a method of switching the encoding method based on the energy of an adaptive codebook vector or gain information has been described as an example in Method 5, the present disclosure is not limited thereto. The encoding method may be switched based on other parameters related to an increase or decrease in the number of unused bits. Alternatively, the encoding method may be switched based on a comparison between the number of unused bits and a threshold value.

<Method 6>

The association between the number of unused bits and the code is not limited to the example illustrated in FIG. 4.

For example, since an upper limit value of the number of unused bits becomes the number of usable bits, an encoded code (or code) equal to or larger than the number of usable bits may not be present. In this case, in the code of the upper limit value of the number of unused bits, 0 at the end of the code (for example, the stop bit) may not be present.

For example, in a case where the number of usable bits is 20 bits and 19 bits become unused bits (for example, in a case where the codebook indicator is "0" (codebook Q0)), the code to be allocated to the number of unused bits is "1110" in the example illustrated in FIG. 4. On the other hand, in a case where the number of usable bits is 20 bits, the number of unused bits does not become 20 bits or more (for example, a code in which four or more of 1 continue as in code "11110"). Accordingly, even when 0 at the end of code "1110" to be allocated to the number of unused bits=19 bits is not present (for example, even "111"), decoder 200 is capable of specifying the number of unused bits.

Accordingly, for example, instead of the example illustrated in FIG. 4, the example illustrated in FIG. 13 may be applied to the association between the number of unused bits and the code. The codes indicated in FIG. 13 correspond to, for example, Huffman codes. In FIG. 13, the number of bits of code "111" in a case where the number of unused bits is the number of bits: 15 to 19 is less by one bit in comparison with that in FIG. 4.

Thus, for example, an encoded code (or encoding information) obtained by encoding the number of unused bits may be represented by a Huffman code in which the number of usable bits is the upper limit value of the number of unused bits. For example, encoder 100 may perform encoding of unused bits by using a Huffman code in accordance with the upper limit of the unused bits. Thus, the number of bits used for encoding of a codebook indicator can be reduced by one bit.

Note that, for example, as illustrated in FIG. 4, a code to be allocated to the number of unused bits may be represented by a unary code. For example, in Method 6, in a case where the upper limit value of the number of unused bits is configured based on the number of usable bits as described above, the least significant bit (LSB) of, among a plurality of unary codes to be allocated to the number of unused bits, a unary code corresponding to the upper limit value of the number of unused bits to be configured based on the number of usable bits may be truncated (or may be deleted). For example, since the upper limit value of the number of unused bits is 19 bits in a case where the number of usable bits is 20 bits in the same manner as in the example described above, the unary code corresponding to the upper limit value of the number of unused bits is four bits of "1110" in the example illustrated in FIG. 4. In Method 6, the least significant bit "0" of the above unary code "1110" may be truncated to be "111", and the association between the number of unused bits and the code is the same as in the example illustrated in FIG. 13. Thus, the number of bits used for encoding of a codebook indicator can be reduced by one bit.

Here, an appropriate bit allocation to a sub-vector makes it easier for a codebook indicator of a longer word length (or number of bits) in accordance with the number of usable bits to be selected for a sub-vector (for example, sub-vector v8) at a specific position. Further, when a codebook indicator of a longer word length is selected, the number of unused bits becomes closer to 0 and it is easier for an encoded code for the number of unused bits of a shorter word length to be selected. Method 6 may utilize this tendency, and encoder 100 may calculate, based on the number of usable bits for a sub-vector at a specific position, the maximum codebook indicator usable for encoding of the sub-vector and express the code to be allocated to the number of unused bits by a Huffman code or a unary code (for example, a code obtained by truncating the LSB of the unary code to be allocated to the number of used bits as the upper limit). Thus, it is possible to reduce an encoded bit of the number of unused bits.

Further, as described in <Method 2>, in a case where the number of usable bits is equal to or larger than 10 bits, a bit which is a remainder of five is likely to be unused. Accordingly, the number of usable bits in Method 6 may be a value obtained by subtracting a remainder of five.

Further, for example, in an occurrence probability distribution related to encoding of the number of unused bits in EVS codec, there may be a distribution in which the probability of the number of unused bits becoming 5 to 9 bits is the highest, the probability of the same becoming 0 to 4 bits is the second highest, and the probability of the same becoming 10 to 14 bits and so forth is the third highest and so forth (for example, in a case where the GC mode is selected). As a method of code allocation with respect to the number of unused bits in the above case, for example, code "0" of the number of unused bits: 0 to 4 bits and code "10" of the number of unused bits: 5 to 9 bits illustrated in FIG. 4 may be interchanged (for example, FIG. 14). In other words, in codes obtained by encoding each of a plurality of candidates for the number of unused bits, the number of bits in a code corresponding to a candidate having a higher probability of occurrence may be less. In the example illustrated in FIG. 14, a code of a fewer number of bits is allocated to the number of unused bits having a higher probability of occurrence, thus, it is possible to reduce an average number of encoded bits. Note that, FIG. 14 is an example, and codes of different numbers of bits may be allocated in accordance with the probability of occurrence of the number of unused bits, respectively. In such allocation, it is sufficient to determine in advance an optimal allocation method for each coding mode, and it is therefore not necessary to encode or transmit information on the allocation method.

Further, for example, the codes allocated to the numbers of unused bits indicated in FIGS. 4, 13, and 14 are unary codes with "0" as the stop bit, but the present disclosure is not limited thereto. For example, codes obtained by interchanging "1" and "0" in the codes allocated to the numbers of unused bits indicated in FIGS. 4, 13, and 14 may be used.

Further, for example, in a case where the encoding method such as <Method 1> or <Method 5> is switched, Huffman coding is applicable to a method of encoding a codebook indicator as is. For example, in a case where the number of usable bits is 23 bits in the example illustrated in FIG. 1, the maximum codebook among codebooks for a sub-vector at a specific position is Q4 (the total number of used bits: 20 bits). At this time, in the example illustrated in FIG. 1, the codebook indicator of Q4 is four bits of "1110". Here, in a case where the number of usable bits is 23 bits, the codebooks of Q5 and so forth (the total number of used bits is equal to or larger than 25 bits) cannot be used. Thus, for example, as illustrated in FIG. 15, the codebook indicator of Q4 may be "111" obtained by omitting "0" from "1110". Thus, the number of encoded bits in a codebook indicator can be reduced.

Methods 1 to 6 have been described above, respectively.

Note that, in an exemplary embodiment of the present disclosure, the codebook list is not limited to the example illustrated in FIG. 1, and the values and numbers of used bits (or the total numbers of used bits) of codes of codebook indicators and code vector indexes in codebooks may be other values. Further, the threshold values described in <Method 1> to <Method 6> described above may be configured in accordance with a codebook list to be applied to encoding and decoding.

Further, for example, in FIG. 1, a case where the ratio of the number of used bits in each codebook indicator to the total number of used bits in each codebook is 1/5 (in other words, in a case where the divisor when a remainder is used is five) has been described, but the present disclosure is not limited thereto.

Further, in the embodiment described above, a case where the number of sub-vectors obtained by dividing input signal S(f) is eight has been described, but the number of sub-vectors obtained by dividing input signal S(f) is not limited to eight.

An embodiment of the present disclosure has been described above.

The present disclosure can be realized by software, hardware, or software in cooperation with hardware. Each functional block used in the description of each embodiment described above can be partly or entirely realized by an LSI such as an integrated circuit, and each process described in the each embodiment may be controlled partly or entirely by the same LSI or a combination of LSIs. The LSI may be individually formed as chips, or one chip may be formed so as to include a part or all of the functional blocks. The LSI may include a data input and output coupled thereto. The LSI here may be referred to as an IC, a system LSI, a super LSI, or an ultra LSI depending on a difference in the degree of integration. However, the technique of implementing an integrated circuit is not limited to the LSI and may be realized by using a dedicated circuit, a general-purpose processor, or a special-purpose processor. In addition, a Field Programmable Gate Array (FPGA) that can be programmed after the manufacture of the LSI or a reconfigurable processor in which the connections and the settings of circuit cells disposed inside the LSI can be reconfigured may be used. The present disclosure can be realized as digital processing or analogue processing. If future integrated circuit technology replaces LSIs as a result of the advancement of semiconductor technology or other derivative technology, the functional blocks could be integrated using the future integrated circuit technology. Biotechnology can also be applied.

The present disclosure can be realized by any kind of apparatus, device or system having a function of communication, which is referred to as a communication apparatus. The communication apparatus may comprise a transceiver and processing/control circuitry. The transceiver may comprise and/or function as a receiver and a transmitter. The transceiver, as the transmitter and receiver, may include an RF (radio frequency) module including amplifiers, RF modulators/demodulators and the like, and one or more antennas. Some non-limiting examples of such a communication apparatus include a phone (e.g., cellular (cell) phone, smart phone), a tablet, a personal computer (PC) (e.g., laptop, desktop, netbook), a camera (e.g., digital still/video camera), a digital player (digital audio/video player), a wearable device (e.g., wearable camera, smart watch, tracking device), a game console, a digital book reader, a tele-health/telemedicine (remote health and medicine) device, and a vehicle providing communication functionality (e.g., automotive, airplane, ship), and various combinations thereof.

The communication apparatus is not limited to be portable or movable, and may also include any kind of apparatus, device or system being non-portable or stationary, such as a smart home device (e.g., an appliance, lighting, smart meter, control panel), a vending machine, and any other "things" in a network of an "Internet of Things (IoT)".

The communication may include exchanging data through, for example, a cellular system, a wireless LAN system, a satellite system, etc., and various combinations thereof.

The communication apparatus may comprise a device such as a controller or a sensor which is coupled to a communication device performing a function of communication described in the present disclosure. For example, the communication apparatus may comprise a controller or a sensor that generates control signals or data signals which are used by a communication device performing a communication function of the communication apparatus.

The communication apparatus also may include an infrastructure facility, such as a base station, an access point, and any other apparatus, device or system that communicates with or controls apparatuses such as those in the above non-limiting examples.

An encoder according to an exemplary embodiment of the present disclosure includes: quantization circuitry, which, in operation, generates quantization parameters including first information and second information, where the first information is information on a codebook of vector quantization and the second information is information on a code vector included in the codebook; and control circuitry, which, in operation, controls encoding of the first information with respect to a sub-vector by using a second number of bits based on a difference between a first number of bits usable for encoding of the sub-vector in the vector quantization and the number of bits for the quantization parameters of the sub-vector.

In an exemplary embodiment of the present disclosure, the control circuitry determines, as encoding information, information obtained by encoding the second number of bits.

In an exemplary embodiment of the present disclosure, the information obtained by encoding the second number of bits is expressed by a Huffman code in which the first number of bits is an upper limit value of the second number of bits.

In an exemplary embodiment of the present disclosure, the information obtained by encoding the second number of bits is expressed by a unary code, and a least significant bit of the unary code corresponding to the upper limit value of the second number of bits configured based on the first number of bits is deleted.

In an exemplary embodiment of the present disclosure, in information obtained by encoding each of a plurality of candidates for the second number of bits, a number of bits in information corresponding to a candidate having a higher probability of occurrence is less.

In an exemplary embodiment of the present disclosure, in a case where the first number of bits is larger than a threshold value, the control circuitry determines, as encoding information, the information obtained by encoding the second number of bits, and in a case where the first number of bits is equal to or less than the threshold value, the control circuitry determines the first information as the encoding information.

In an exemplary embodiment of the present disclosure, in a case where a signal to be subjected to the vector quantization is a harmonic signal in Generic Coding (mode) of Enhanced Voice Services (EVS) codec, the sub-vector is, among a plurality of the sub-vectors obtained by dividing the signal, a sub-vector having a highest frequency or a sub-vector that is temporally the last.

In an exemplary embodiment of the present disclosure, in a case where energy of the code vector with respect to the sub-vector is equal to or larger than a threshold value, the control circuitry determines, as encoding information, information obtained by encoding the second number of bits, and in a case where the energy of the code vector is less than the threshold value, the control circuitry determines the first information as the encoding information.

In an exemplary embodiment of the present disclosure, in a case where a gain with respect to the sub-vector is equal to or larger than a threshold value, the control circuitry determines, as encoding information, information obtained by encoding the second number of bits, and in a case where the gain is less than the threshold value, the control circuitry determines the first information as the encoding information.

In an exemplary embodiment of the present disclosure, the second number of bits is a number obtained by subtracting the number of bits for the quantization parameters of the sub-vector from a remainder of five with respect to the first number of bits.

A decoder according to an exemplary embodiment of the present disclosure includes: control circuitry, which, in operation, controls decoding of first information with respect to a sub-vector by using a second number of bits based on a difference between a first number of bits usable for encoding of the sub-vector in vector quantization and a number of bits for quantization parameters including first information and second information, where the first information is information on a codebook of the sub-vector and the second information is information on a code vector included in the codebook; and inverse quantization circuitry, which, in operation, performs inverse vector quantization based on the first information.

An encoding method according to an exemplary embodiment of the present disclosure includes: generating, by an encoder, quantization parameters including first information and second information, where the first information is information on a codebook of vector quantization and the second information is information on a code vector included in the codebook; and controlling, by the encoder, encoding of the first information with respect to a sub-vector by using a second number of bits based on a difference between a first number of bits usable for encoding of the sub-vector in the vector quantization and a number of bits for the quantization parameters of the sub-vector.

A decoding method according to an exemplary embodiment of the present disclosure includes: controlling, by a decoder, decoding of first information with respect to a sub-vector by using a second number of bits based on a difference between a first number of bits usable for encoding of the sub-vector in vector quantization and a number of bits for quantization parameters including first information and second information, where the first information is information on a codebook of the sub-vector and the second information is information on a code vector included in the codebook; and performing, by the decoder, inverse vector quantization based on the first information.

The disclosure of Japanese Patent Application No. 2020-105470, filed on Jun. 18, 2020, including the specification, drawings, and abstract, is incorporated herein by reference in its entirety.

INDUSTRIAL APPLICABILITY

An exemplary embodiment of the present disclosure is useful for a coding system or the like.

REFERENCE SIGNS LIST

51 CELP encoder
52 CELP local decoder
53, 65 Adder
64 CELP decoder
71 LPC analyzer
72 Quantizer
73, 84 Inverse quantizer
74 LPC inverse filter
85 LPC synthesis filter
100, 100a, 100b Encoder
54, 75, 101 Time-frequency converter 102 Psychoacoustic model analyzer
103 Split multi-rate lattice quantizer
104 Codebook indicator converter
105 Multiplexer
121 Codebook indicator separator
122, 221 Number-of-usable-bits calculator
123 Number-of-unused-bits calculator
124 Number-of-unused-bits encoder
200, 200a, 200b Decoder
201 Demultiplexer
202 Codebook indicator inverse converter
203 Split multi-rate lattice inverse quantizer
63, 83, 204 Frequency-time converter
222 Number-of-unused-bits decoder
223 Decoder
224 Codebook indicator generator

The invention claimed is:

1. An encoder of an audio or speech signal, the encoder comprising:

time-frequency converting circuitry, which, in operation, converts an input signal in a time domain into a signal in a frequency domain;

quantization circuitry, which, in operation, divides the signal in the frequency domain into a plurality of sub-vectors and, in operation, generates quantization parameters including a codebook index and a code vector index for each of the plurality of sub-vectors, the codebook index indicating a codebook for vector quantization, the code vector index indicating one of a plurality of code vectors included in the codebook; and control circuitry, which, in operation, controls:

calculating a number of usable bits for encoding the quantization parameters for a certain sub-vector among the plurality of sub-vectors by subtracting a total number of bits for encoding the quantization parameters for the plurality of sub-vectors except the quantization parameters for the certain sub-vector from a number of available bits for encoding the quantization parameters for the signal in the frequency domain;

calculating a remainder of five of the number of usable bits and subtracting the calculated value of the remainder from the number of usable bits for the certain sub-vector to obtain a subtraction result; and calculating a number of unused bits for the certain sub-vector by subtracting a number of bits necessary for encoding the quantization parameters for the certain sub-vector from the subtraction result;

encoding the number of unused bits for the certain sub-vector; and encoding the quantization parameters for the plurality of sub-vectors except the certain sub-vector, wherein:

the control circuitry determines, as encoding information, information obtained by encoding the number of unused bits, in a case where a gain for the certain sub-vector is equal to or larger than a threshold value, the control circuitry encodes the number of unused bits, and in a case where the gain is less than the threshold value, the control circuitry encodes the quantization parameters for the certain sub-vector.

2. The encoder according to claim 1, wherein the information obtained by encoding the number of unused bits is expressed by a Huffman code in which the number of usable bits is an upper limit value of the number of unused bits.

3. The encoder according to claim 1, wherein: the information obtained by encoding the number of unused bits is expressed by a unary code, and a least significant bit of the unary code is deleted.

4. The encoder according to claim 1, wherein, a plurality of candidate values are prepared for the number of unused bits, a number of bits necessary for encoding the quantization parameters corresponding to a candidate value having a higher probability of occurrence is smaller than that corresponding to other candidate values.

5. The encoder according to claim 1, wherein:

in a case where the number of usable bits is larger than a threshold value, the control circuitry encodes the number of unused bits for the certain sub-vector, and in a case where the first number of bits is equal to or less than the threshold value, the control circuitry encodes the quantization parameters for the certain sub-vector.

6. The encoder according to claim 1, wherein in a case where the signal in the frequency domain is a harmonic signal in Generic Coding (mode) of Enhanced Voice Services (EVS) codec, the certain sub-vector is, among the plurality of the sub-vectors, a sub-vector having a highest frequency.

7. The encoder according to claim 1, wherein:

in a case where energy of the code vector for the certain sub-vector is equal to or larger than a threshold value, the control circuitry encodes the number of unused bits, and in a case where the energy of the code vector is less than the threshold value, the control circuitry encodes the quantization parameters for the certain sub-vector.

8. An encoding method for an encoder of an audio or speech signal, the encoding method comprising:

converting an input signal in a time domain into a signal in a frequency domain;

dividing the signal in the frequency domain into a plurality of sub-vectors;

generating quantization parameters including a codebook index and a code vector index for each of the plurality of sub-vectors, the codebook index indicating a codebook for vector quantization, the code vector index indicating one of a plurality of code vectors included in the codebook; and controlling:

calculating a number of usable bits for encoding the quantization parameters for a certain sub-vector among the plurality of sub-vectors by subtracting a total number of bits for encoding the quantization parameters for the plurality of sub-vectors except the quantization parameters for the certain sub-vector from a number of available bits for encoding the quantization parameters for the signal in the frequency domain;

calculating a remainder of five of the number of usable bits and subtracting the calculated value of the remainder from the number of usable bits for the certain sub-vector to obtain a subtraction result; and calculating a number of unused bits for the certain sub-vector by subtracting a number of bits necessary for encoding the quantization parameters for the certain sub-vector from the subtraction result;

encoding the number of the number of unused bits for the certain sub-vector; and encoding the quantization parameters for the plurality of sub-vectors except the certain sub-vector; and determining, as encoding information, information obtained by encoding the number of unused bits, wherein:

in a case where a gain for the certain sub-vector is equal to or larger than a threshold value, the method further comprises encoding the number of unused bits, and in a case where the gain is less than the threshold value, the method further comprises encoding the quantization parameters for the certain sub-vector.

* * * * *